(12) United States Patent
Tsutsui

(10) Patent No.: US 8,354,726 B2
(45) Date of Patent: Jan. 15, 2013

(54) SEMICONDUCTOR DEVICE AND METHOD FOR FABRICATING THE SAME

(75) Inventor: Masafumi Tsutsui, Shiga (JP)

(73) Assignee: Panasonic Corporation, Osaka (JP)

( * ) Notice: Subject to any disclaimer, the term of this patent is extended or adjusted under 35 U.S.C. 154(b) by 975 days.

(21) Appl. No.: 11/798,528

(22) Filed: May 15, 2007

(65) Prior Publication Data

US 2007/0267707 A1 Nov. 22, 2007

(30) Foreign Application Priority Data

May 19, 2006 (JP) ................................. 2006-139728

(51) Int. Cl.
*H01L 29/76* (2006.01)

(52) U.S. Cl. ............................. 257/369; 257/E27.062

(58) Field of Classification Search .......... 257/288–413, 257/E27.06, E27.062
See application file for complete search history.

(56) References Cited

U.S. PATENT DOCUMENTS

| | | | | |
|---|---|---|---|---|
| 6,271,081 B2 * | 8/2001 | Kajiyama | ...................... | 438/243 |
| 6,730,973 B2 * | 5/2004 | Hibi et al. | ...................... | 257/390 |
| 6,806,584 B2 * | 10/2004 | Fung et al. | ...................... | 257/368 |
| 7,132,704 B2 * | 11/2006 | Grudowski | ...................... | 257/288 |
| 7,132,707 B2 * | 11/2006 | Min et al. | ...................... | 257/295 |
| 7,504,284 B2 * | 3/2009 | Ye et al. | ...................... | 438/109 |
| 7,504,289 B2 * | 3/2009 | Lim et al. | ...................... | 438/154 |
| 7,868,390 B2 * | 1/2011 | Chou et al. | ...................... | 257/369 |
| 2001/0019156 A1 * | 9/2001 | Matsuo et al. | ...................... | 257/368 |
| 2005/0133836 A1 * | 6/2005 | Seo et al. | ...................... | 257/288 |
| 2005/0266631 A1 * | 12/2005 | Kim et al. | ...................... | 438/216 |
| 2005/0285137 A1 * | 12/2005 | Satoh | ............................ | 257/178 |
| 2007/0090455 A1 * | 4/2007 | Lim et al. | ...................... | 257/338 |
| 2008/0296633 A1 * | 12/2008 | Adams et al. | ................. | 257/255 |

FOREIGN PATENT DOCUMENTS

| | | |
|---|---|---|
| EP | 1 693 897 A2 | 8/2006 |
| JP | 2005-57301 | 3/2005 |

OTHER PUBLICATIONS

Capodieci et al (Toward methodology for manufacturability-driven design rule exploration, DAC 2004, Jun. 7-11, 2004, San Diego, California).*

Capodieci et al(Toward methodology for manufacturability-driven design rule exploration, DAC 2004, Jun. 7-11, 2004, San Diego, California).*

(Continued)

*Primary Examiner* — Matthew W Such
*Assistant Examiner* — Ali Naraghi
(74) *Attorney, Agent, or Firm* — McDermott Will & Emery LLP

(57) ABSTRACT

A semiconductor device includes: a first active region surrounded with an isolation region of a semiconductor substrate; a first gate electrode formed over the first active region and having a protrusion protruding on the isolation region; a first side-wall insulating film; an auxiliary pattern formed to be spaced apart in the gate width direction from the protrusion of the first gate electrode; a second side-wall insulating film; and a stress-containing insulating film containing internal stress and formed to cover the first gate electrode, the first side-wall insulating film, the auxiliary pattern, and the second side-wall insulating film. In this device, the distance between the first gate electrode and the auxiliary pattern is smaller than the sum total of: the sum of the thicknesses of the first and second side-wall insulating films; and the double of the thickness of the stress-containing insulating film.

64 Claims, 15 Drawing Sheets

OTHER PUBLICATIONS

Capodicei et al(Toward Methodology for manufacturability-driven design rule exploration, DAC 2004, Jun. 7-11, 2004, San Diego, California).*

Capodicei et al(Toward Methology for manufacturability-driven design rule exploration, DAC 2004, Jun. 7-11, 2004, SanDiego, California).*

Extended European Search Report issued in European Patent Application No. EP 07 10 8449, dated Aug. 7, 2007.

Chan, V., et al., "Strain for CMOS performance Improvement", IEEE 2005 Custom Integrated Circuits Conference, 2005, pp. 662-669, IEEE.

* cited by examiner

SEMICONDUCTOR DEVICE AND METHOD FOR FABRICATING THE SAME

BACKGROUND OF THE INVENTION (a) Fields of the Invention

The present invention relates to semiconductor devices and their fabrication methods. In particular, the present invention relates to a semiconductor device having a structure in which an insulating film with internal stress covering a gate electrode of a field effect transistor produces stress in a channel region.

(b) Description of Related Art

In recent years, in order to enhance the speed of a semiconductor device, a structure and a method for improving the carrier mobility of the device have been proposed. In these structure and method, a film with internal stress is used to produce stress on a region where carriers flow (a channel region) from the outside, thereby improving the carrier mobility.

FIGS. 17, 18A, and 18B show a conventional semiconductor device having a structure in which an insulating film with internal stress produces stress on a channel region (see, for example, Japanese Unexamined Patent Publication No. 2005-57301). FIG. 17 is a plan view corresponding to the line XVII-XVII in FIGS. 18A and 18B. FIG. 18A is a sectional view corresponding to the line XVIIIa-XVIIIa in FIG. 17, and FIG. 18B is a sectional view corresponding to the line XVIIIb-XVIIIb in FIG. 17.

As shown in FIGS. 17, 18A, and 18B, a semiconductor substrate 100 is formed with an isolation region 101 which defines an active region 100a. Above the active region 100a surrounded with the isolation region 101, a gate electrode 103 having a silicide layer 103a is formed with a gate insulating film 102 interposed therebetween. The side surfaces of the gate electrode 103 and the silicide layer 103a are formed with a side-wall insulating film 113 which is composed of a first sidewall 105 having an L-shaped cross section and a second sidewall 106. Regions of the active region 100a located outside the side-wall insulating film 113 are formed with a source region 107s having a silicide layer 107sa in its top-layer portion and a drain region 108d having a silicide layer 108da in its top-layer portion, respectively. Over the semiconductor substrate 100, a liner film 109 of a silicon nitride film having internal stress is formed to cover the gate electrode 103 and the side-wall insulating film 113. The top of the liner film 109 is formed with an interlayer insulating film 110. The interlayer insulating film 110 is formed with contact plugs 111 penetrating both of the interlayer insulating film 110 and the liner film 109 to reach the silicide layers 107sa and 108da, respectively. The top of the interlayer insulating film 110 is formed with interconnects 112 whose bottom surfaces are connected to the top ends of the contact plugs 111, respectively.

In the conventional semiconductor device thus constructed, as is apparent from FIG. 17, the liner film 109 having internal stress is formed to enclose the gate electrode 103 in the state in which the side-wall insulating film 113 on the side surface of the gate electrode 103 is interposed therebetween.

In this structure, the direction of the channel length in which carriers flow (the channel length direction) is set to the direction in which the source region 107 and the drain region 108 are connected to each other. Then, if the liner film 109 has tensile internal stress, it tends to shrink in its entirety. This applies stress onto the active region 100a, which results in application of tensile stress S1 in the channel length direction of the channel region. For an n-type field effect transistor (an n-type MIS transistor), application of such stress enhances the carrier mobility to increase the current therein, and therefore the semiconductor device can operate at high speed.

For the structure as shown above in which the insulating film with internal stress is formed to enclose the gate electrode, for example, as shown in FIGS. 17 and 18B, the liner film 109 with internal stress also covers an end of a protruding portion of the gate electrode 103 located on the isolation region 101 (referred hereinafter to as "a protrusion of a gate electrode"). Thus, if the liner film 109 with internal stress has tensile internal stress, it tends to shrink in its entirety. In response to this tendency, the protrusion of the gate electrode 103 is compressed in the direction of the channel width that is perpendicular to the channel length direction. This in turn gives compressive stress S2 in the channel width direction of the channel region connected through the gate insulating film 102 to the gate electrode 103.

For a semiconductor element using a (001) substrate and passing carriers in the <110> direction, the channel width direction is the <1-10> direction. Therefore, regardless of whether an n-type MIS transistor using an electron as a carrier or a p-type MIS transistor using a hole as a carrier is employed as the semiconductor element, application of the compressive stress S2 to the channel width direction of the channel region decreases the carrier mobility. As a result, even though the insulating film with internal stress applies tensile stress S1 in the channel length direction of the channel region, the effect of enhancing the carrier mobility provided by the tensile stress S1 is counteracted. Even for a semiconductor element using a (001) substrate and passing carriers in the <100> direction, the effect of enhancing the carrier mobility is counteracted in the same way.

Moreover, as the channel width is smaller, the influence of compressive stress in the channel width direction exerted on the channel region by the protrusion of the gate electrode becomes more significant. As the protrusion of the gate electrode is shorter, the distance from the tip of the protrusion of the gate electrode to the channel region becomes shorter to increase the influence of the compressive stress in the channel width direction exerted on the channel region by the protrusion. These disadvantages are expected to cause problems to future miniaturization of the semiconductor element.

SUMMARY OF THE INVENTION

In view of the foregoing, an object of the present invention is to provide a semiconductor device which is designed to have an excellent carrier mobility and to be well suited for miniaturization, and to provide its fabrication method.

A semiconductor device according to one aspect of the present invention includes: a first active region surrounded with an isolation region of a semiconductor substrate; a first gate electrode formed over the first active region and having a protrusion protruding on the isolation region; a first side-wall insulating film formed on the side surface of the first gate electrode; an auxiliary pattern formed over the semiconductor substrate to be spaced apart in the gate width direction from the protrusion of the first gate electrode; a second side-wall insulating film formed on the side surface of the auxiliary pattern; and a stress-containing insulating film containing internal stress and formed to cover the first gate electrode, the first side-wall insulating film, the auxiliary pattern, and the second side-wall insulating film. In this device, the distance between the first gate electrode and the auxiliary pattern is smaller than the sum total of: the sum of the thicknesses of the first and second side-wall insulating films; and the double of the thickness of the stress-containing insulating film.

With the semiconductor device according to one aspect of the present invention, the distance between the first gate electrode and the auxiliary pattern is smaller than the sum total of: the sum of the thicknesses of the first and second side-wall insulating films; and the double of the thickness of the stress-containing insulating film. Thereby, compressive stress in the channel width direction produced by compression of a portion of the stress-containing insulating film covering the protrusion of the first gate electrode is relieved by compression of a portion of the stress-containing insulating film covering the auxiliary pattern. This enhances the carrier mobility in a channel of a field effect transistor including the first gate electrode, and provides the structure applicable to miniaturization of the semiconductor device.

In the semiconductor device according to one aspect of the present invention, a portion of the stress-containing insulating film formed in an area between the first gate electrode and the auxiliary pattern has a greater thickness than a portion of the stress-containing insulating film formed on the isolation region spaced apart in the gate length direction from the first side-wall insulating film.

With this device, the carrier mobility in the channel of the field effect transistor including the first gate electrode can be further enhanced, and the structure applicable to further miniaturization of the semiconductor device can be provided.

In the semiconductor device according to one aspect of the present invention, the top surface of a portion of the stress-containing insulating film formed in an area between the first gate electrode and the auxiliary pattern has an equal level to or a higher level than the top surface of the first gate electrode.

With this device, the carrier mobility in the channel of the field effect transistor including the first gate electrode can be further enhanced, and the structure applicable to further miniaturization of the semiconductor device can be provided.

In the semiconductor device according to one aspect of the present invention, if the space between the first gate electrode and the auxiliary pattern is filled with the first and second side-wall insulating films and the stress-containing insulating film, the effect of reducing compressive stress in the channel width direction applied by the stress-containing insulating film can be exerted as described above.

In the semiconductor device according to one aspect of the present invention, if the distance between the first gate electrode and the auxiliary pattern is smaller than the sum total of: the sum of the thicknesses of the first and second side-wall insulating films; and the double of the thickness of the stress-containing insulating film, the space between the first gate electrode and the auxiliary pattern can be filled with the stress-containing insulating film having a level equal to or greater than the level of the first gate electrode.

In the semiconductor device according to one aspect of the present invention, if the space between the first gate electrode and the auxiliary pattern is filled with the first and second side-wall insulating films, the stress-containing insulating film is not formed to fill the space between the first gate electrode and the auxiliary pattern. Therefore, compressive stress applied by the stress-containing insulating film to the protrusion of the first gate electrode is relieved. This provides the effect of reducing compressive stress in the channel width direction applied by the stress-containing insulating film.

In the above case, if the distance between the first gate electrode and the auxiliary pattern is smaller than the sum of the thicknesses of the first and second side-wall insulating films, the space between the first gate electrode and the auxiliary pattern can be filled with the first and second stress-containing insulating films each having a level equal to or greater than the level of the first gate electrode.

In the semiconductor device according to one aspect of the present invention, each of the first and second side-wall insulating films may include a first sidewall with an L-shaped cross section.

In the semiconductor device according to one aspect of the present invention, each of the first and second side-wall insulating films may further include a second sidewall formed to cover an L-shaped inner surface of the first sidewall.

In the semiconductor device according to one aspect of the present invention, if each of the second sidewalls contains internal stress, compressive stress in the channel width direction produced by compression of the second sidewall covering the protrusion of the first gate electrode is relieved by compression of the second sidewall covering the auxiliary pattern.

In the semiconductor device according to one aspect of the present invention, the auxiliary pattern may be a second gate electrode which is formed over a second active region surrounded with the isolation region of the semiconductor substrate and which has a protrusion protruding on the isolation region.

In the semiconductor device according to one aspect of the present invention, the side surfaces of the first and second gate electrodes located in the gate length direction may face each other.

In the semiconductor device according to one aspect of the present invention, the side surfaces of the first and second gate electrodes located in the gate length direction may face each other in shifted relation in the gate length direction.

In the semiconductor device according to one aspect of the present invention, the auxiliary pattern may be formed only on the isolation region.

In the semiconductor device according to one aspect of the present invention, the auxiliary pattern may not effectively perform electrical operations.

In the semiconductor device according to one aspect of the present invention, the auxiliary pattern may be made of a different material from that of the first gate electrode.

A method for fabricating a semiconductor device according to one aspect of the present invention includes: the step (a) of forming a first active region surrounded with an isolation region of a semiconductor substrate; the step (b) of forming, over the first active region, a first gate electrode having a protrusion protruding on the isolation region; the step (c) of forming an auxiliary pattern over the semiconductor substrate to be spaced apart in the gate width direction from the protrusion of the first gate electrode; the step (d) of forming a first side-wall insulating film on the side surface of the first gate electrode and a second side-wall insulating film on the side surface of the auxiliary pattern; and the step (e) of forming a stress-containing insulating film to cover the first gate electrode, the first side-wall insulating film, the auxiliary pattern, and the second side-wall insulating film, the stress-containing insulating film containing internal stress. In the step (c), the auxiliary pattern is formed so that the distance between the first gate electrode and the auxiliary pattern is smaller than the sum total of: the sum of the thicknesses of the first and second side-wall insulating films; and the double of the thickness of the stress-containing insulating film.

With the method for fabricating a semiconductor device according to one aspect of the present invention, the auxiliary pattern is formed so that the distance between the first gate electrode and the auxiliary pattern is smaller than the sum total of: the sum of the thicknesses of the first and second side-wall insulating films; and the double of the thickness of the stress-containing insulating film. Thereby, compressive stress in the channel width direction produced by compression of a portion of the stress-containing insulating film covering the protrusion of the first gate electrode is relieved by compression of a portion of the stress-containing insulating film covering the auxiliary pattern. This enhances the carrier mobility in a channel of a field effect transistor including the first gate electrode, and provides the structure applicable to miniaturization of the semiconductor device.

In the method for fabricating a semiconductor device according to one aspect of the present invention, in the step (e), a portion of the stress-containing insulating film formed in an area between the first gate electrode and the auxiliary pattern has a greater thickness than a portion of the stress-containing insulating film formed on the isolation region spaced apart in the gate length direction from the first side-wall insulating film.

With this method, the carrier mobility in the channel of the field effect transistor including the first gate electrode can be further enhanced, and the structure applicable to further miniaturization of the semiconductor device can be provided.

In the method for fabricating a semiconductor device according to one aspect of the present invention, in the step (e), the top surface of a portion of the stress-containing insulating film formed in an area between the first gate electrode and the auxiliary pattern has an equal level to or a higher level than the top surface of the first gate electrode.

With this method, the carrier mobility in the channel of the field effect transistor including the first gate electrode can be further enhanced, and the structure applicable to further miniaturization of the semiconductor device can be provided.

In the method for fabricating a semiconductor device according to one aspect of the present invention, if the step (c) includes the step of forming the auxiliary pattern so that the distance between the first gate electrode and the auxiliary pattern is smaller than the sum total of: the sum of the thicknesses of the first and second side-wall insulating films; and the double of the thickness of the stress-containing insulating film and in the step (e), the stress-containing insulating film is formed to fill the space between the first and second side-wall insulating films which is located between the first gate electrode and the auxiliary pattern, the effect of reducing compressive stress in the channel width direction applied by the stress-containing insulating film can be exerted as described above.

In the method for fabricating a semiconductor device according to one aspect of the present invention, if the step (c) includes the step of forming the auxiliary pattern so that the distance between the first gate electrode and the auxiliary pattern is smaller than the sum of the thicknesses of the first and second side-wall insulating films and in the step (d), the first and second side-wall insulating films are formed to fill the space between the first gate electrode and the auxiliary pattern, the stress-containing insulating film is not formed to fill the space between the first gate electrode and the auxiliary pattern. Therefore, compressive stress applied by the stress-containing insulating film to the protrusion of the first gate electrode is relieved. This provides the effect of reducing compressive stress in the channel width direction applied by the stress-containing insulating film.

In the method for fabricating a semiconductor device according to one aspect of the present invention, in the step (c), the auxiliary pattern may be formed only on the isolation region.

In the method for fabricating a semiconductor device according to one aspect of the present invention, the auxiliary pattern may be a second gate electrode, the step (a) may include the step of forming a second active region surrounded with the isolation region of the semiconductor substrate, and the step (c) may be carried out simultaneously in the step (b) and be the step of forming, on the second active region, the second gate electrode having a protrusion protruding on the isolation region.

Preferably, in the method for fabricating a semiconductor device according to one aspect of the present invention, the step (d) includes the step of forming the first side-wall insulating film and the second side-wall insulating film each composed of a first sidewall with an L-shaped cross section and a second sidewall covering an L-shaped inner surface of the first sidewall.

The method for fabricating a semiconductor device according to one aspect of the present invention may further include, after the step (d) and before the step (e), the step of removing the second sidewalls constituting the first and second side-wall insulating films, respectively.

As described above, with the semiconductor device according to one aspect of the present invention, compressive stress in the channel width direction produced by compression of the portion of the stress-containing insulating film covering the protrusion of the first gate electrode is relieved by the portion of the stress-containing insulating film covering the auxiliary pattern. This enhances the carrier mobility in the channel of the field effect transistor including the first gate electrode, and provides the structure applicable to miniaturization of the semiconductor device. Moreover, the influence of the shape of the protrusion of the first gate electrode is reduced to enhance the carrier mobility, and thus the resulting device is applicable to device miniaturization.

BRIEF DESCRIPTION OF THE DRAWINGS

FIG. 2A is a sectional view corresponding to the line IIa-IIa in FIG. 1, and FIG. 2B is a sectional view corresponding to the line IIb-IIb in FIG. 1.

FIGS. 4A, 4C, and 4E illustrate process steps corresponding to the cross section shown in FIG. 2A, and FIGS. 4B, 4D, and 4F illustrate process steps corresponding to the cross section shown in FIG. 2B.

FIG. 9A is a sectional view corresponding to the line IXa-IXa in FIG. 8, and FIG. 9B is a sectional view corresponding to the line IXb-IXb in FIG. 8.

FIGS. 10A, 10C, and 10E illustrate process steps corresponding to the cross section shown in FIG. 9A, and FIGS. 10B, 10D, and 10F illustrate process steps corresponding to the cross section shown in FIG. 9B.

FIG. 15A is a sectional view corresponding to the line XVa-XVa in FIG. 14, and FIG. 15B is a sectional view corresponding to the line XVb-XVb in FIG. 14.

FIGS. 16A, 16C, and 16E illustrate process steps corresponding to the cross section shown in FIG. 15A, and FIGS. 16B, 16D, and 16F illustrate process steps corresponding to the cross section shown in FIG. 15B.

FIG. 18A is a sectional view corresponding to the line XVIIIa-XVIIIa in FIG. 17, and FIG. 18B is a sectional view corresponding to the line XVIIIb-XVIIIb in FIG. 17.

DETAILED DESCRIPTION OF THE PREFERRED EMBODIMENTS (First Embodiment)

A semiconductor device and its fabrication method according to a first embodiment of the present invention will now be described.

Figure 1:
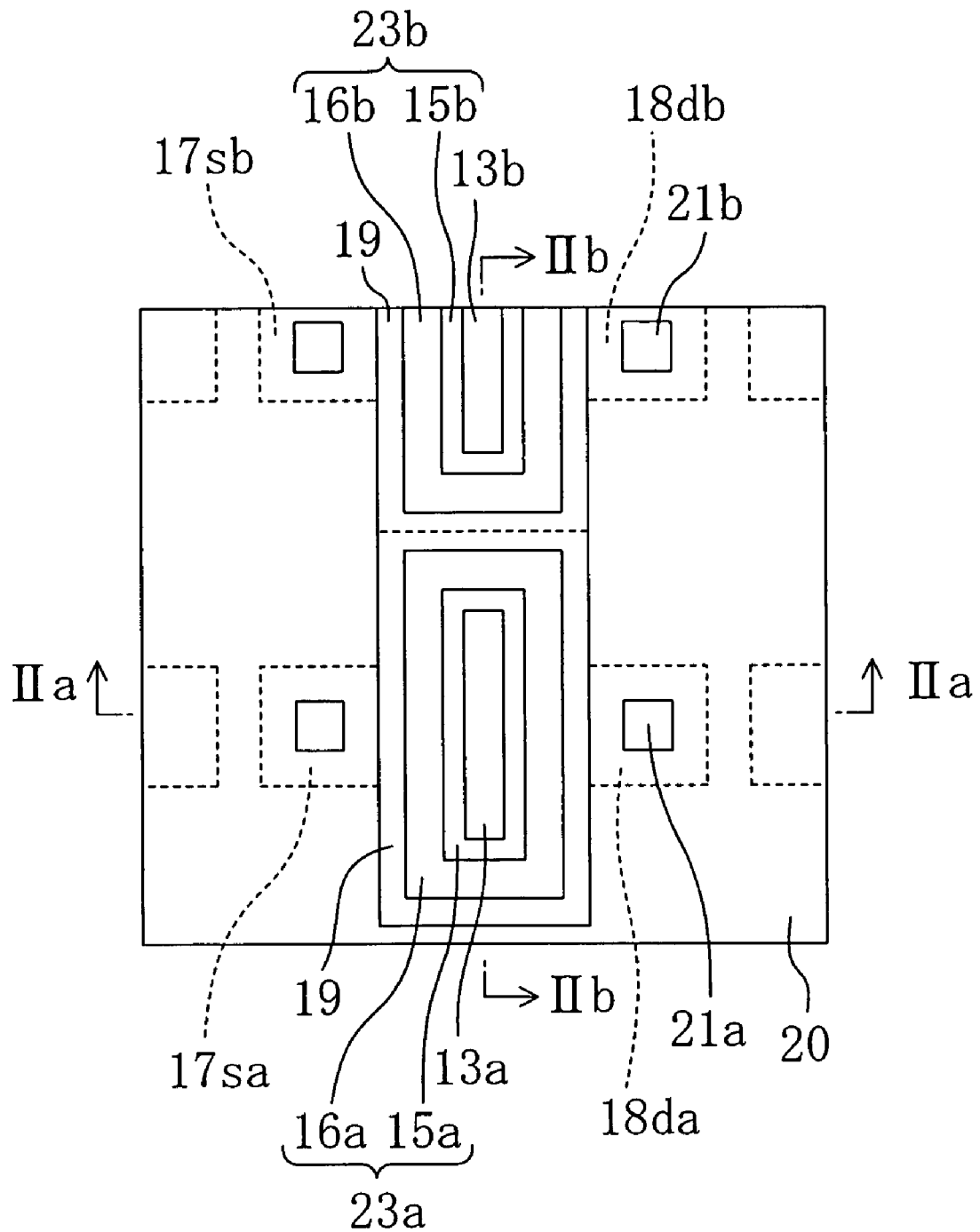
FIG. 1 is a plan view showing the structure of a semiconductor device according to a first embodiment of the present invention and corresponding to the line I-I in FIGS. 2A and 2B.
Figure 2A:
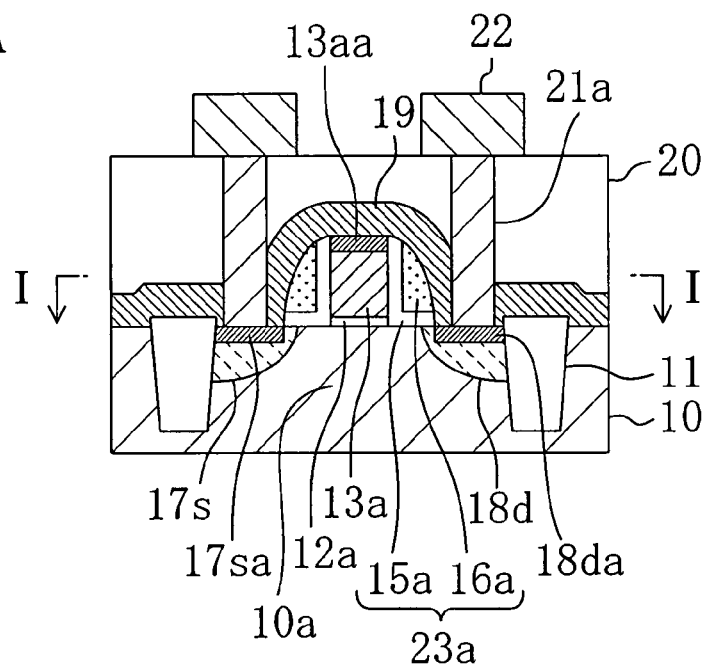
FIGS. 2A and 2B show the structure of the semiconductor device according to the first embodiment of the present invention.
Figure 2B:
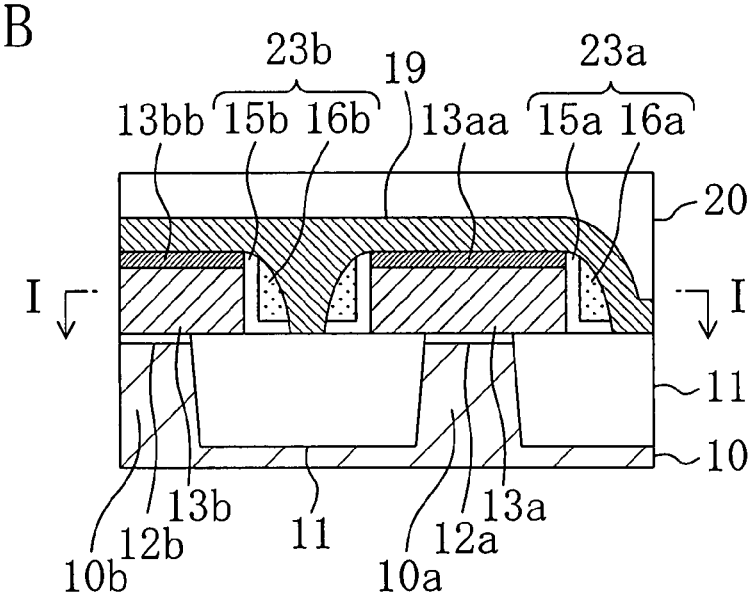

FIGS. 1, 2A, and 2B show the structure of the semiconductor device according to the first embodiment of the present invention. FIG. 1 is a plan view corresponding to the line I-I in FIGS. 2A and 2B. FIG. 2A is a sectional view corresponding to the line IIa-IIa in FIG. 1, and FIG. 2B is a sectional view corresponding to the line IIb-IIb in FIG. 1.

First, referring to the sectional view in FIG. 2A illustrated across the direction of a gate length (the gate length direction), a semiconductor substrate 10 made of silicon is formed with an isolation region 11 of STI (shallow trench isolation) defining an active region 10a and made by filling a trench with an insulating film. Above the active region 10a surrounded with the isolation region 11, a gate electrode 13a having a silicide layer 13aa in its top-layer portion is formed with a gate insulating film 12a interposed therebetween. The side surfaces of the gate electrode 13a and the silicide layer 13aa are formed with a first side-wall insulating film 23a composed of a first sidewall 15a having an L-shaped cross section and a second sidewall 16a. Regions of the active region 10a located outside the first side-wall insulating film 23a are formed with a source region 17s having a silicide layer 17sa in its top-layer portion and a drain region 18d having a silicide layer 18da in its top-layer portion, respectively.

Over the semiconductor substrate 10, a liner film 19 as a stress-containing insulating film containing internal stress is formed to cover the gate electrode 13a, the first side-wall insulating film 23a, and the like. The top of the liner film 19 is formed with an interlayer insulating film 20. The interlayer insulating film 20 is formed with contact plugs 21a which penetrate the interlayer insulating film 20 and the liner film 19 to reach the silicide layer 17sa and the silicide layer 18da, respectively. The top of the interlayer insulating film 20 is formed with interconnects 22 whose bottom surfaces are connected to the top ends of the contact plugs 21a, respectively. Note that portions of the active region 10a located below both sides of the gate electrode 13a are formed with extension regions or LDD regions (not shown) connected to the source region 17s and the drain region 18d, respectively.

Next, in the sectional view in FIG. 2B illustrated across the direction of a gate width (the gate width direction), the semiconductor substrate 10 is formed with the isolation region 11 defining the active regions 10a and 10b. Above the active region 10a surrounded with the isolation region 11 (and also on part of the isolation region 11), the gate electrode 13a having the silicide layer 13aa in its top-layer portion is formed with the gate insulating film 12a interposed therebetween. The gate electrode 13a has protruding portions which protrude on the isolation regions 11 formed on the both sides thereof, respectively, to interpose the active region 10a. Above the active region 10b surrounded with the isolation region 11, a gate electrode 13b having a silicide layer 13bb in its top-layer portion is formed with a gate insulating film 12b interposed therebetween. The gate electrode 13b has protruding portions which protrude on the isolation regions 11 formed on the both sides thereof, respectively, to interpose the active region 10b. The first and second gate electrodes 13a and 13b may be made of the same material or different materials. The side surfaces of the gate electrode 13a and the silicide layer 13aa are formed with the first side-wall insulating film 23a composed of the first and second sidewalls 15a and 16a, and the side surfaces of the gate electrode 13b and the silicide layer 13bb are formed with a second side-wall insulating film 23b composed of a first sidewall 15b having an L-shaped cross section and a second sidewall 16b. Although not shown in FIG. 2B, portions of the active region 10b located outside the second side-wall insulating film 23b are formed with a source region and a drain region connected through contact plugs 21b (see FIG. 1) to interconnects (not shown), respectively, as in the case of the sectional view in FIG. 2A. As shown in FIG. 1, the source region has a silicide layer 17sb (see FIG. 1) in its top-layer portion, and the drain region has a silicide layer 18db in its top-layer portion.

Over the semiconductor substrate 10, the liner film 19 of a silicon nitride film or the like containing internal stress is formed to cover the gate electrodes 13a and 13b, the first and second side-wall insulating films 23a and 23b, and the like. The liner film 19 contains internal stress producing tensile stress in the channel length direction of the active region 10a and also producing compressive stress in the channel width direction of the active region 10a. The top of the liner film 19 is formed with the interlayer insulating film 20.

In FIGS. 1, 2A, and 2B, description has been made of the case where the first sidewall 15a having an L-shaped cross section and the second sidewall 16a are formed as the components of the first side-wall insulating film 23a and the first sidewall 15b having an L-shaped cross section and the second sidewall 16b are formed as the components of the second side-wall insulating film 23b. Alternatively, it is acceptable that the first sidewalls 15a and 15b having L-shaped cross sections are not formed, or it is acceptable that instead of or in addition to the first sidewalls 15a and 15b, sidewalls (offset spacers) having I-shaped (plate-like) cross sections are formed, respectively. The liner film 19 may be formed of a single layer or multiple layers.

In this structure, as shown in FIGS. 1 and 2B, the liner film 19 is formed to enclose a combination of the gate electrode 13a and the first side-wall insulating film 23a and a combination of the gate electrode 13b and the second side-wall insulating film 23b. Also, the first and second side-wall insulating films 23a and 23b are spaced apart from each other, and the liner film 19 is formed to fill the space therebetween. Furthermore, the top surface of a portion of the liner film 19 filling this space is formed to have an equal level to or a higher level than the top surfaces of the first and second gate electrodes 13a and 13b.

In the semiconductor device with the above-described structure according to the first embodiment of the present invention, the liner film 19 is formed over the protruding portion of the gate electrode 13a protruding from the active region 10a onto the isolation region 11 closer to the active region 10b (referred hereinafter to as "a protrusion of the gate electrode 13a"), and the liner film 19 formed over this portion applies compressive stress in the channel width direction (the gate width direction) of the active region 10a. However, with the device according to the first embodiment, the compressive stress can be relieved. The reason for this will now be described.

As mentioned above, the liner film 19 is formed to fill the space between the first and second side-wall insulating films 23a and 23b and to have an equal level to or a higher level than the gate electrodes 13a and 13b. With this structure, compressive stress in the channel width direction applied by compression of a portion of the liner film 19 covering the protrusion of the gate electrode 13a is compensated and relieved by simultaneous compression of a portion of the liner film 19 covering the gate electrode 13b and the second side-wall insulating film 23b. From the same reason, compressive stress in the channel width direction (the gate width direction) of the active region 10b can also be relieved which is applied by a portion of the liner film 19 formed over the protruding portion of the gate electrode 13b (referred hereinafter to as "a protrusion of the gate electrode 13b") protruding from the active region 10b onto the isolation region 11 closer to the active region 10a.

Figure 3A:
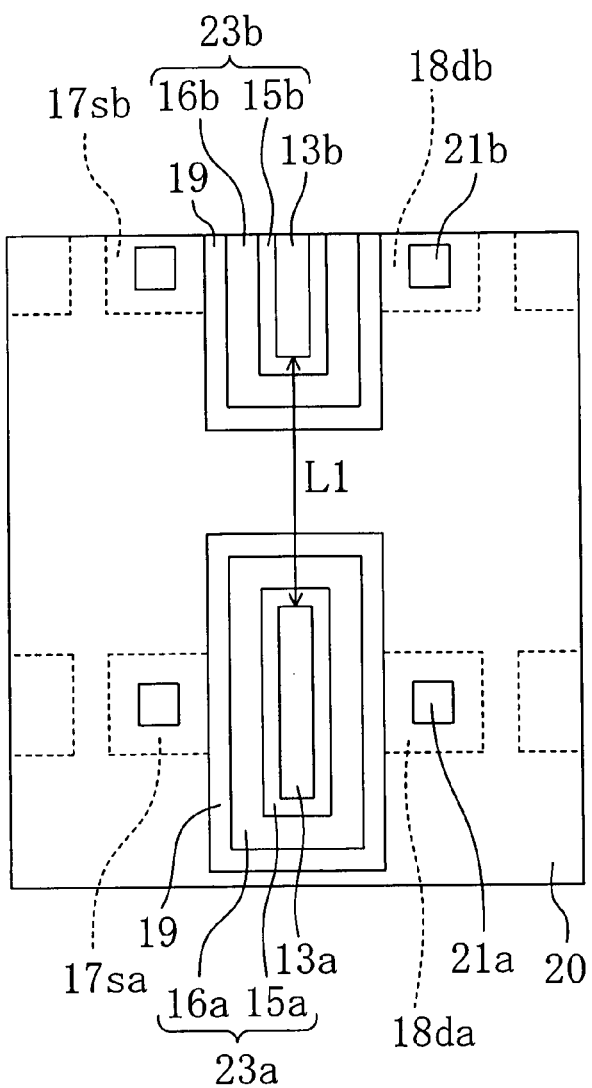
FIG. 3A is a plan view for explaining the distance between gate protrusions in the device according to the first embodiment of the present invention.
Figure 3B:
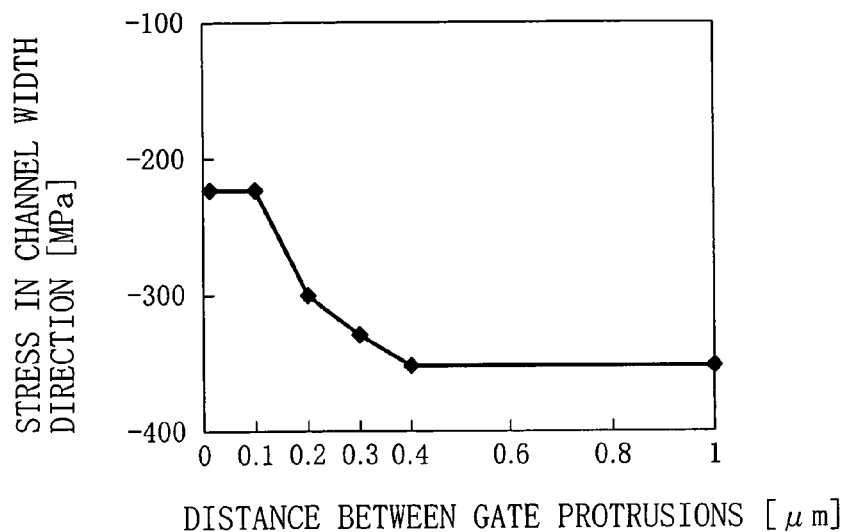
FIG. 3B is a graph showing the relation between the distance between the gate protrusions and compressive stress in the channel width direction, which is applied by a portion of a liner film 19 covering a protrusion of a gate electrode 13a protruding from an active region 10c.

FIG. 3A is a plan view for explaining the distance between the gate protrusions in the device according to the first embodiment of the present invention, and FIG. 3B is a graph showing the relation between the distance between the gate protrusions and compressive stress in the channel width direction of the active region 10a, which is applied by a portion of the liner film 19 covering the protrusion of the gate electrode 13a.

As shown in FIG. 3A, first, the distance between the end of the gate electrode 13a and the end of the gate electrode 13b is set as the distance L1 between the gate protrusions, and compressive stress in the channel width direction of the active region 10a is calculated with the distance L1 between the gate protrusions changed. From this calculation, the result shown in FIG. 3B is obtained. This calculation is made using the structure in which the thicknesses (widths) of the first sidewalls 15a and 15b are 20 nm, the thicknesses (widths) of the second sidewalls 16a and 16b are 50 nm, and the thickness (width) of the liner film 19 is 100 nm.

To be more specific, as can be understood from FIG. 3B, when the distance L1 between the gate protrusions is zero, that is, when the end of the gate electrode 13a and the ends of the gate electrode 13b are in contact with each other, compressive stress applied by the liner film 19 onto the channel width direction of the active region 10a becomes nearly zero.

On the other hand, as can also be understood from FIG. 3B, when the distance between the end of the gate electrode 13a and the end of the gate electrode 13b is long, that is, when the distance L1 between the gate protrusions is as long as, for example, 1 µm, the presence of the portion of the liner film 19 covering the gate electrode 13b and the second side-wall insulating film 23b cannot relieve compressive stress in the channel width direction of the active region 10a, which is applied by the portion of the liner film 19 covering the protrusion of the gate electrode 13a.

As the distance L1 between the gate protrusions is decreased, the effect of reducing compressive stress in the channel width direction is increasingly recognized. To be more specific, when the distance L1 between the gate protrusions is 0.34 µm or smaller at which the liner film 19 can be formed to fill the space between the first and side-wall insulating films 23a and 23b and to have an equal level to or a higher level than the gate electrodes 13a and 13b, the portion of the liner film 19 covering the gate electrode 13b and the second side-wall insulating film 23b exerts the effect of reducing compressive stress in the channel width direction of the active region 10a, which is applied by the portion of the liner film 19 covering the protrusion of the gate electrode 13a.

That is to say, if the distance L1 between the gate protrusions is equal to or smaller than the sum total (340 nm) of: the double of the thickness of the liner film 19 (100 nm×2=200 nm); the sum of the thicknesses of the first sidewalls 15a and 15b (20 nm+20 nm=40 nm); and the sum of the thicknesses of the second sidewalls 16a and 16b (50 nm+50 nm=100 nm), the liner film 19 can be formed to fill the space between the first and second side-wall insulating films 23a and 23b and to have an equal level to or a higher level than the gate electrodes 13a and 13b. In this calculation, for example, the thicknesses of the first sidewalls 15a and 15b indicate the formation thickness of a first insulating film serving as the first sidewalls 15a and 15b, and the thicknesses of the second sidewalls 16a and 16b indicate the formation thickness of a second insulating film serving as the second sidewalls 16a and 16b.

For example, as shown in FIG. 3B, when the distance L1 between the gate protrusions is set at 0.1 µm, a stress of about 120 MPa is reduced as compared to the stress obtained when the distance L1 between the gate protrusions is 0.4 µm. As a result of calculation from the piezoresistance effect, if the device employed is an NMOS field effect transistor passing carriers in the <100> direction, such stress reduction can provide the effect of enhancing the carrier mobility by about 5%.

The above description has been made of the case where the gate electrode 13b constitutes the field effect transistor. Alternatively, the case where it does not constitute the field effect transistor may be employed. Even in this case, if it is designed to satisfy the above-shown condition of the distance L1 between the gate protrusions, the same effect as the effect described above can be provided.

In the first embodiment, description has been made of the case where for an auxiliary pattern for relieving stress on the gate electrode 13a, the gate electrode 13b of the adjacent transistor is used. However, the auxiliary pattern is not limited to this, and it is sufficient to use an auxiliary pattern with the same level as the gate electrode 13a. As the auxiliary pattern, for example, use may be made of: a dummy gate electrode, an interconnect pattern, or a resistor pattern provided in the manner in which a film of the same material as the gate electrode 13a is patterned simultaneously with patterning of the gate electrode 13a; or a dummy pattern provided by patterning a film of a different material from the gate electrode 13a. It is acceptable that the auxiliary pattern is formed only on the isolation region or only on a portion of the semiconductor substrate surrounded with the isolation region. Or, it is also acceptable that it is formed to extend from the top of the isolation region onto the portion of the semiconductor substrate surrounded with the isolation region. In addition, the gate electrode 13b as the auxiliary pattern is disposed beside only one of the protrusions of the gate electrode 13a, but the auxiliary pattern may be disposed beside the both protrusions of the gate electrode 13a. If the auxiliary pattern is used only to relieve stress on the gate electrode 13a, it is sufficient that the auxiliary pattern has a length in the gate width direction of about 0.1 μm and a length in the gate length direction equal to or more than the width of the gate electrode 13a in the gate length direction.

The conductivity type of the field effect transistor including the gate electrode 13a may be p-type or n-type. Also in the case where the gate electrode 13b constitutes a field effect transistor, its conductivity may be p-type or n-type.

Next description will be made of a method for fabricating a semiconductor device according to the first embodiment of the present invention.

Figure 4A:
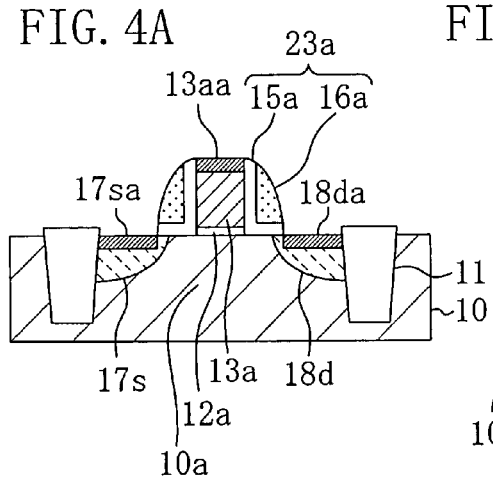
FIGS. 4A to 4F are views showing process steps of fabricating a semiconductor device according to the first embodiment of the present invention.
Figure 4B:
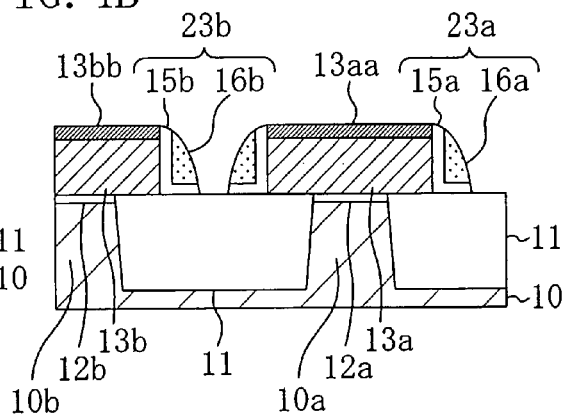
Figure 4C:
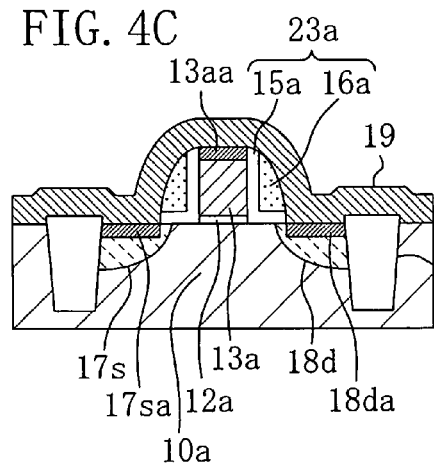
Figure 4D:
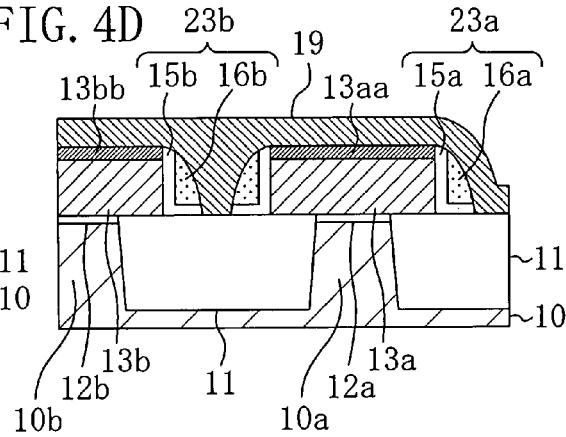
Figure 4E:
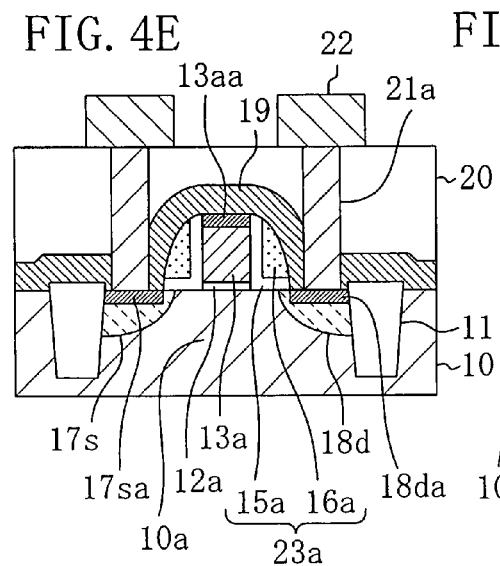

FIGS. 4A to 4F are views showing process steps of fabricating a semiconductor device according to the first embodiment of the present invention. FIGS. 4A, 4C, and 4E illustrate process steps corresponding to the cross section shown in FIG. 2A, and FIGS. 4B, 4D, and 4F illustrate process steps corresponding to the cross section shown in FIG. 2B. The following description will be made of the structure in which the field effect transistor including the gate electrode 13a is an n-type MIS transistor and the field effect transistor including the gate electrode 13b is a p-type MIS transistor.

Referring to FIGS. 4A and 4B, first, the semiconductor substrate 10 made of silicon or the like is formed with the isolation region 11 of STI defining the active regions 10a and 10b and made by filling a trench with an insulating film. Subsequently, a gate-insulating-film formation film of $SiO_2$, SiON, HfSiON, or the like is formed on the active regions 10a and 10b surrounded with the isolation region 11, and then a gate-electrode formation film of polysilicon or the like is formed on the gate-insulating-film formation film. By lithography and dry etching techniques, the gate insulating films 12a and 12b made of the gate-insulating-film formation film and the gate electrodes 13a and 13b made of the gate-electrode formation film are formed. In this manner, above the active region 10a, the gate electrode 13a is formed with the gate insulating film 12a interposed therebetween, and above the active region 10b, the gate electrode 13b is formed with the gate insulating film 12b interposed therebetween. Although in this method the gate electrodes 13a and 13b are made of the same material, they can also be made of different materials. In this structure, the gate electrodes 13a and 13b are adjacently disposed to have a distance equal to or smaller than the sum total of the double of the thickness of the liner film 19 to be described later, the sum of the thicknesses of the first sidewalls 15a and 15b to be described later, and the sum of the thicknesses of the second sidewalls 16a and 16b to be described later. For example, in the first embodiment, considering the fact that the ends of the gate electrodes 13a and 13b are made small during etching, they are arranged to have a distance of about 200 nm or smaller. In this structure, for example, the thicknesses of the first sidewalls 15a and 15b indicate the formation thickness of the first insulating film serving as the first sidewalls 15a and 15b, and the thicknesses of the second sidewalls 16a and 16b indicate the formation thickness of the second insulating film serving as the second sidewalls 16a and 16b.

Next, using the gate electrode 13a as a mask, arsenic ions as an n-type impurity are implanted into the active region 10a on the condition of an implantation energy of 10 keV and an implantation dose of $10^{14}/cm^2$, thereby forming an n-type extension region or an LDD region (not shown). Also, using the gate electrode 13b as a mask, boron ions as a p-type impurity are implanted into the active region 10b on the condition of an implantation energy of 2 keV and an implantation dose of $10^{14}/cm^2$, thereby forming a p-type extension region or an LDD region (not shown).

Over the entire surface of the semiconductor substrate 10, a first insulating film of $SiO_2$ or the like having a thickness of about 20 nm and a second insulating film of $Si_3N_4$ having a thickness of about 50 nm are sequentially formed to cover the gate electrodes 13a and 13b. Thereafter, the second insulating film and the first insulating film are sequentially etched back to form the first sidewalls 15a and 15b made of the first insulating film and the second sidewalls 16a and 16b made of the second insulating film. In this manner, on the side surface of the gate electrode 13a, the first side-wall insulating film 23a is formed which is composed of: the first sidewall 15a with an L-shaped cross section; and the second sidewall 16a formed to cover the L-shaped inner surface (the bottom and side surfaces) of the first sidewall 15a. Simultaneously with this, on the side surface of the gate electrode 13b, the second side-wall insulating film 23b is formed which is composed of: the first sidewall 15b with an L-shaped cross section; and the second sidewall 16b formed to cover the L-shaped inner surface (the bottom and side surfaces) of the first sidewall 15b.

Next, using the gate electrode 13a and the first side-wall insulating film 23a as a mask, arsenic ions as an n-type impurity are implanted into a portion of the active region 10a located outside the first side-wall insulating film 23a on the condition of an implantation energy of 10 keV and an implantation dose of $10^{15}/cm^2$, thereby forming n-type high-concentration impurity regions serving as the source region 17s and the drain region 18d, respectively. Also, using the gate electrode 13b and the second side-wall insulating film 23b as a mask, boron ions as a p-type impurity are implanted into a portion of the active region 10b located outside the second side-wall insulating film 23b on the condition of an implantation energy of 2 keV and an implantation dose of $10^{15}/cm^2$, thereby forming p-type high-concentration impurity regions serving as source and drain regions (not shown), respectively.

Over the entire surface of the semiconductor substrate 10, a metal film of cobalt, nickel, or the like is deposited to have a thickness of about 50 nm, and then a thermal treatment is performed to allow silicon to react with metal contained in the metal film. Thereby, the silicide layer 17sa and the silicide layer 18da are formed in the top portions of the source region 17s and the drain region 18d located outside the first side-wall insulating film 23a, respectively, and the silicide layer 13aa is formed in the top portion of the gate electrode 13a. Simultaneously with this, the silicide layer 17sb and the silicide layer 18db (see FIG. 1) are formed in the top portions of the source region and the drain region located outside the second sidewall insulating film 23b, respectively, and the silicide layer 13bb is formed in the top portion of the gate electrode 13b.

Next, in the step shown in FIGS. 4C and 4D, over the entire surface of the semiconductor substrate 10, the liner film 19 of, for example, a silicon nitride film serving as a stress-containing insulating film containing internal stress is deposited to cover the gate electrodes 13a and 13b, the first side-wall insulating film 23a, and the second side-wall insulating film 23b. The liner film 19 is formed by a LP-CVD method or the like to have a thickness of about 100 nm. In this formation, since the distance between the gate electrode 13a and the gate electrode 13b is about 200 nm or smaller as described above, the liner film 19 is formed to fill the space between the first side-wall insulating film 23a and the second side-wall insulating film 23b and to have a top surface with an equal level to or a higher level than the top surfaces of the gate electrodes 13a and 13b. To be more specific, the distance between the gate electrode 13a and the gate electrode 13b is 200 nm, whereas the sum total of the sum of the thicknesses of the first sidewalls 15a and 15b (20 nm+20 nm=40 nm), the sum of the thicknesses (widths) of the second sidewalls 16a and 16b (50 nm+50 nm=100 nm), and the double of the thickness of the liner film 19 (100 nm×2=200 nm) is 340 nm. Therefore, the distance between the gate electrode 13a and the gate electrode 13b are filled with the first sidewalls 15a and 15b, the second sidewalls 16a and 16b, and the liner film 19, and the liner film 19 is formed so that the top surface thereof has an equal level to or a higher level than the top surfaces of the gate electrodes 13a and 13b.

Figure 4F:
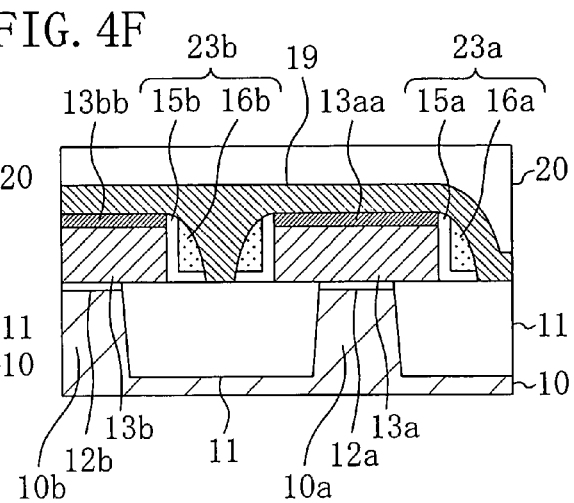

Subsequently, in the step shown in FIGS. 4E and 4F, on the liner film 19, the interlayer insulating film 20 of, for example, a silicon oxide film is deposited to have a thickness of about 500 nm, and then the surface of the deposited film is planarized by CMP. Using a photoresist pattern (not shown) as a mask, contact holes penetrating the interlayer insulating film 20 and the liner film 19 are formed by dry etching with a gas such as $CF_4$, and then the contact holes are filled with metal such as tungsten to form the contact plugs 21a and 21b (see FIG. 1). Thereby, in the n-type MIS transistor, the source region 17s is electrically connected through the silicide layer 17sa to the contact plug 21a, and the drain region 18d is connected through the silicide layer 18da to the contact plug 21a. Also, in the p-type MIS transistor, the source region is electrically connected through the silicide layer 17sb to the contact plug 21b, and the drain region is connected through the silicide layer 18db to the contact plug 21b. Thereafter, on the interlayer insulating film 20, a conductive film of aluminum or the like is deposited to have a thickness of about 100 nm, and then the deposited conductive film is patterned to form the interconnect 22 connected to the contact plug 21a and an interconnect (not shown) connected to the contact plug 21b.

With the above-described method for fabricating a semiconductor device according to the first embodiment of the present invention, the structure of the semiconductor device shown with FIGS. 2A and 2B and the effects exerted by this structure can be provided.

—First Modification of First Embodiment—

Figure 5A:
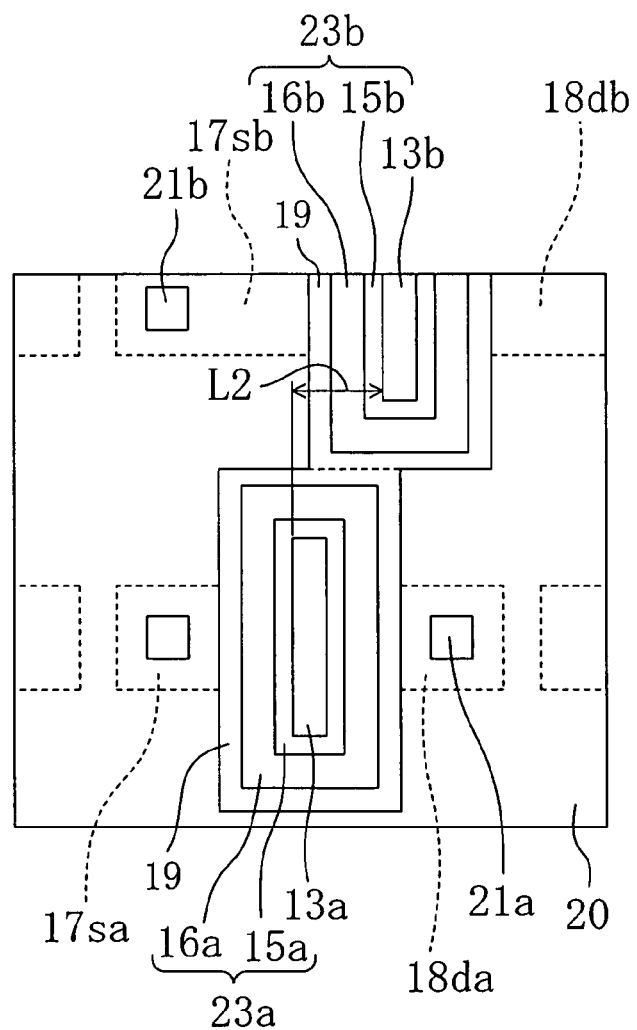
FIG. 5A is a plan view showing the structure of a semiconductor device according to a first modification of the first embodiment of the present invention.
Figure 5B:
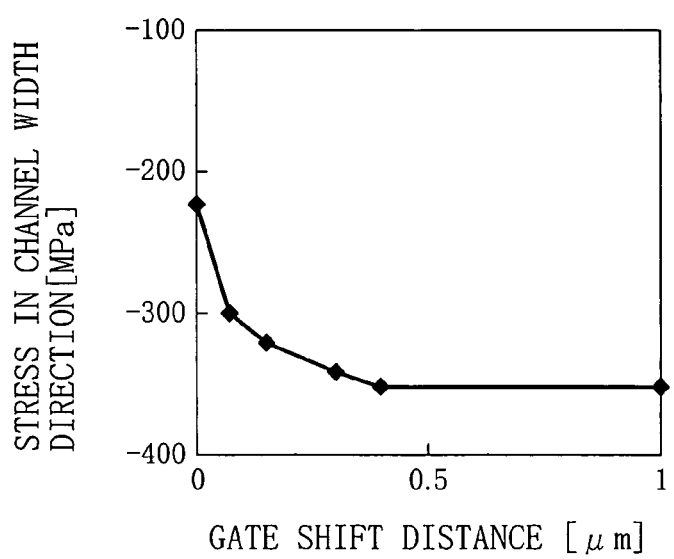
FIG. 5B is a graph showing the relation between the gate shift distance and compressive stress in the channel width direction in the device according to the first modification.

FIG. 5A is a plan view showing a semiconductor device with a structure in which in the structure of the semiconductor device shown in FIG. 1, the gate electrode 13b is shifted in the gate length direction. As shown in FIG. 5A, the distance of the shift in the gate length direction is set as the gate shift distance L2, and compressive stress in the channel width direction of the active region 10a is calculated with the gate shift distance L2 changed. From this calculation, the result shown in FIG. 5B is obtained. This calculation is made using the structure in which the gate lengths of the gate electrodes 13a and 13b are 50 nm, the thicknesses (widths) of the first sidewalls 15a and 15b are 20 nm, the thicknesses (widths) of the second sidewalls 16a and 16b are 50 nm, and the thickness (width) of the liner film 19 is 100 nm. The distance between the gate electrode 13a and the gate electrode 13b is about 340 nm or smaller, and the space therebetween is filled with the first sidewalls 15a and 15b, the second sidewalls 16a and 16b, and the liner film 19.

For a typical semiconductor device, there may be the case where it is impossible to arrange the gate electrode 13a and the gate electrode 13b to face each other and thus as shown in FIG. 5A, they are disposed closely but in shifted relation. Even in such a case, if as shown in FIG. 5B, the gate shift distance L2 is not less than 0 μm and less than 0.39 μm, the effect of reducing compressive stress in the channel width direction of the active region 10a, which is applied by a portion of the liner film 19 covering the protrusion of the gate electrode 13a, can be exerted. In this structure, 0.39 μm, which is the gate shift distance L2 described above, is the sum total of: the gate length of the gate electrode 13a (50 nm); the sum of the thicknesses of the first and second sidewalls 15a and 16a formed on one side surface of the gate electrode 13a and the thickness of the liner film 19 (20 nm+50 nm+100 nm=170 nm); and the sum of the thicknesses of the first and second sidewalls 15b and 16b formed on one side surface of the gate electrode 13b and the thickness of the liner film 19 (20 nm+50 nm+100 nm=170 nm). That is to say, if the amount of shift of the gate electrode 13b in the gate length direction relative to the gate electrode 13a is within an extent such that the portion of the liner film 19 formed on the side surface of the gate electrode 13a and the portion of the liner film 19 formed on the side surface of the gate electrode 13b at least partly overlap in the gate length direction, the effects as described above can be provided.

—Second Modification of First Embodiment—

Figure 6:
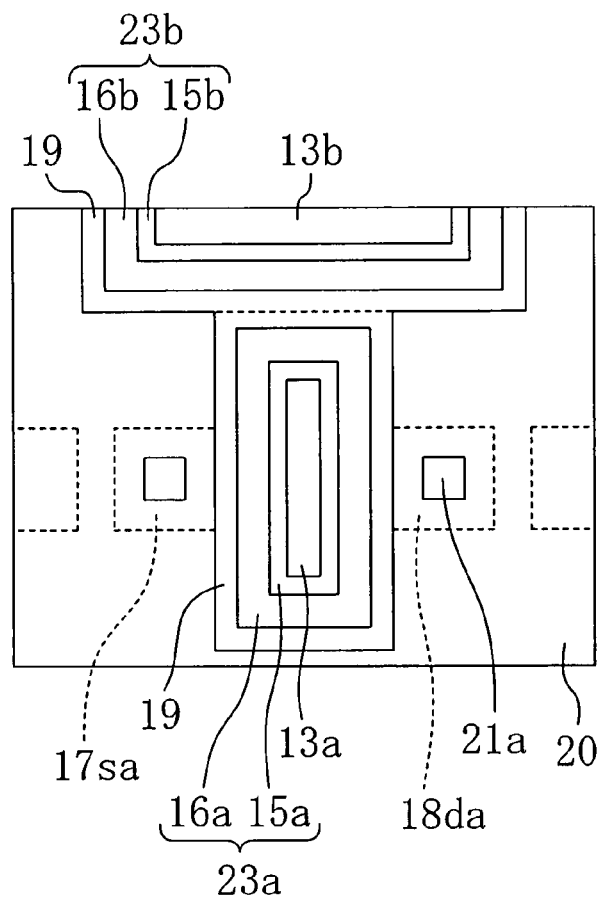
FIG. 6 is a plan view showing the structure of a semiconductor device according to a second modification of the first embodiment of the present invention.

Furthermore, for a typical semiconductor device, there may be the case where as shown in FIG. 6, the gate electrodes 13b and 13a are closely arranged so that the side surface of the gate electrode 13b in the gate width direction faces the side surface of the gate electrode 13a in the gate length direction and thus the gate width of the gate electrode 13b is greater than the gate length of the gate electrode 13a. Even in such a case, it is sufficient that they also satisfy the arrangement relation for obtaining the distance L1 between the gate protrusions shown in FIG. 3B. To be more specific, in the case where the distance from the side surface of the gate electrode 13b located across the gate width direction to the side surface of the gate electrode 13a located across the gate length direction is set as the distance L1 between the gate protrusions, if the arrangement relation described using FIG. 3B is satisfied, the effect of reducing compressive stress in the channel width direction of the active region 10a, which is applied by the portion of the liner film 19 covering the protrusion of the gate electrode 13a, can be provided.

—Third Modification of First Embodiment—

Figure 7:
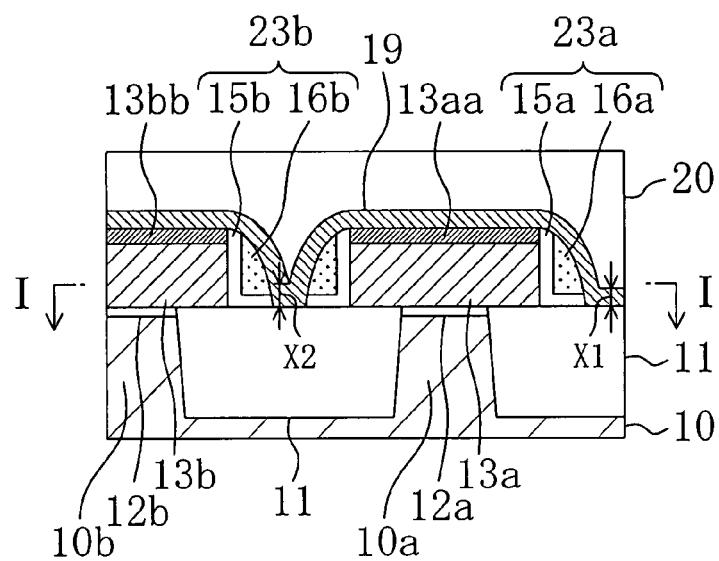
FIG. 7 is a sectional view showing the structure of a semiconductor device according to a third modification of the first embodiment of the present invention.

In the first embodiment shown above, description has been made of the case where the liner film 19 fills the space between the first and second side-wall insulating films 23a and 23b and the liner film 19 is formed so that the top surface thereof has an equal level to or a higher level than the top surfaces of the gate electrodes 13a and 13b. In contrast to this, in the third modification, as shown in FIG. 7, the top surface of a portion of the liner film 19 formed in the space between the first and second side-wall insulating films 23a and 23b does not reach an equal level to the top surfaces of the gate electrodes 13a and 13b unlike the first embodiment, and nevertheless the liner film 19 is formed so that the thickness X2 (the thickness of a portion of the liner film 19 located at the center portion thereof between the gate electrode 13a and the gate electrode 13b) is greater than the deposition thickness X1 (the thickness of a portion of the liner film 19 located on the isolation region 11). Thus, if the liner film 19 is formed so that the thickness X2 of the portion of the liner film 19 formed in the space between the first and second side-wall insulating films 23a and 23b is greater than the deposition thickness X1, the effect of reducing compressive stress in the channel width direction of the active region 10a can be provided. Specifically, in the first embodiment described above, in the case where the distance L1 between the gate protrusions is changed on the condition that the thickness of the liner film 19 is 100 nm, the distance enough to provide the effect of reducing compressive stress in the channel width direction is obtained by calculation. In this case, the calculation is made on the condition that the first and second side-wall insulating films 23a and 23b are set to have uniform thicknesses (widths). However, as shown in FIG. 7, actual first and second side-wall insulating films 23a and 23b are formed to have a tapered shape in which the upper region is thinner (narrower) than the lower region. When the liner film 19 is formed in the space between the first and second side-wall insulating films 23a and 23b having such tapered shapes, the liner film 19 is sometimes formed so that the thickness X2 thereof is at least greater than the deposition thickness X1 like the third modification while the top surface thereof does not reach an equal level to the top surfaces of the gate electrodes 13a and 13b. Even in this case, if the liner film 19 is formed so that the thickness X2 of the portion of the liner film 19 formed in the space between the first and second side-wall insulating films 23a and 23b is greater than the deposition thickness X1, the above effect can be exerted in theory. Note that the structure in the third modification is designed to be identical to the structure in the first embodiment except for the thickness of the portion of the liner film 19 formed in the space between the first and second side-wall insulating films 23a and 23b. The deposition thickness X1 indicates the thickness of the film portion formed under no influence of the level difference of the underlying shape and the like. For example, in FIG. 1, the deposition thickness X1 indicates the thickness of a portion of the liner film 19 formed on the isolation region 11 spaced apart in the gate length direction from the gate electrode 13a and the first side-wall insulating film 23a.

(Second Embodiment)

The structure of a semiconductor device according to a second embodiment of the present invention will be described below.

Figure 8:
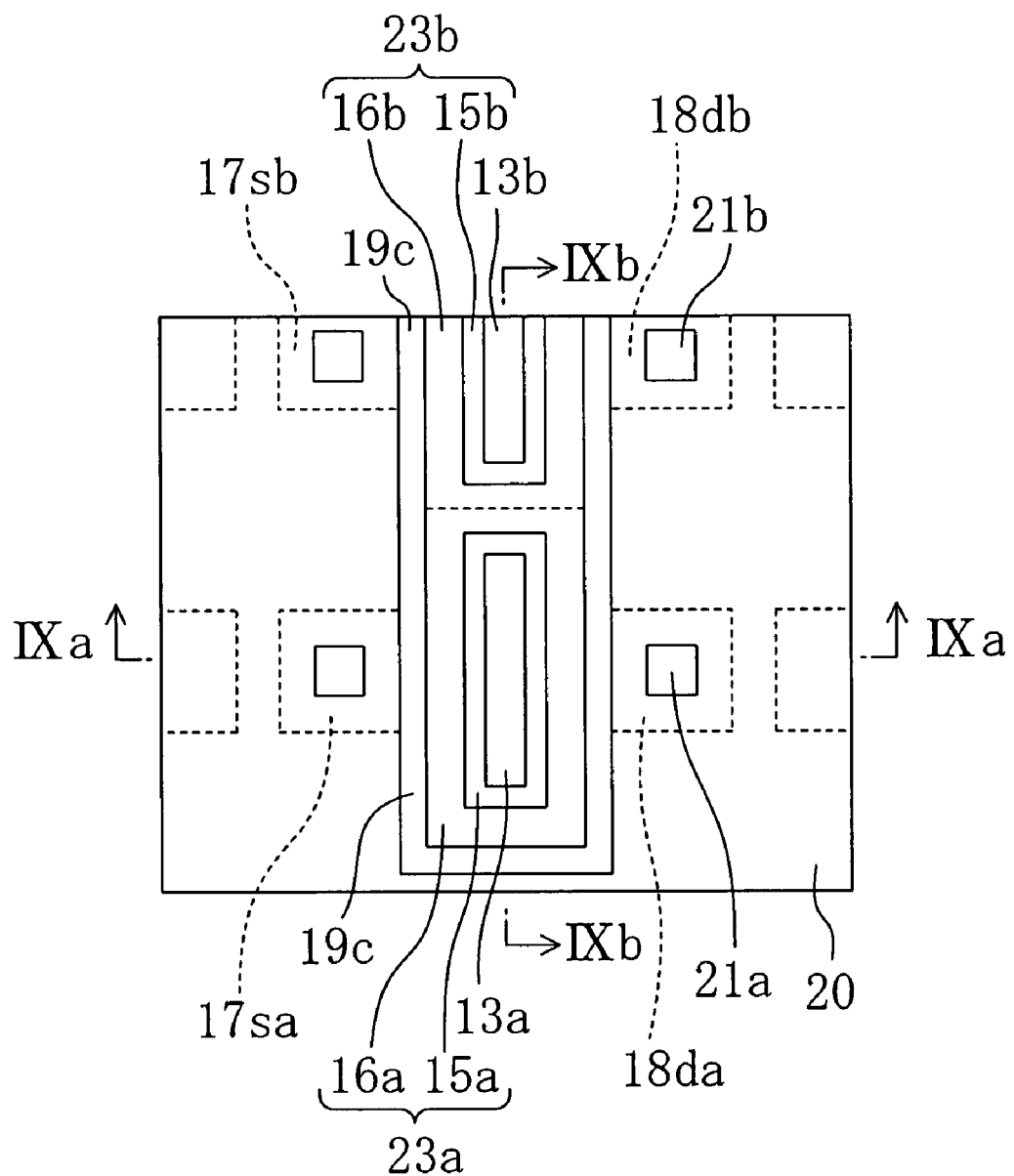
FIG. 8 is a plan view showing the structure of a semiconductor device according to a second embodiment of the present invention and corresponding to the line VIII-VIII in FIGS. 9A and 9B.
Figure 9A:
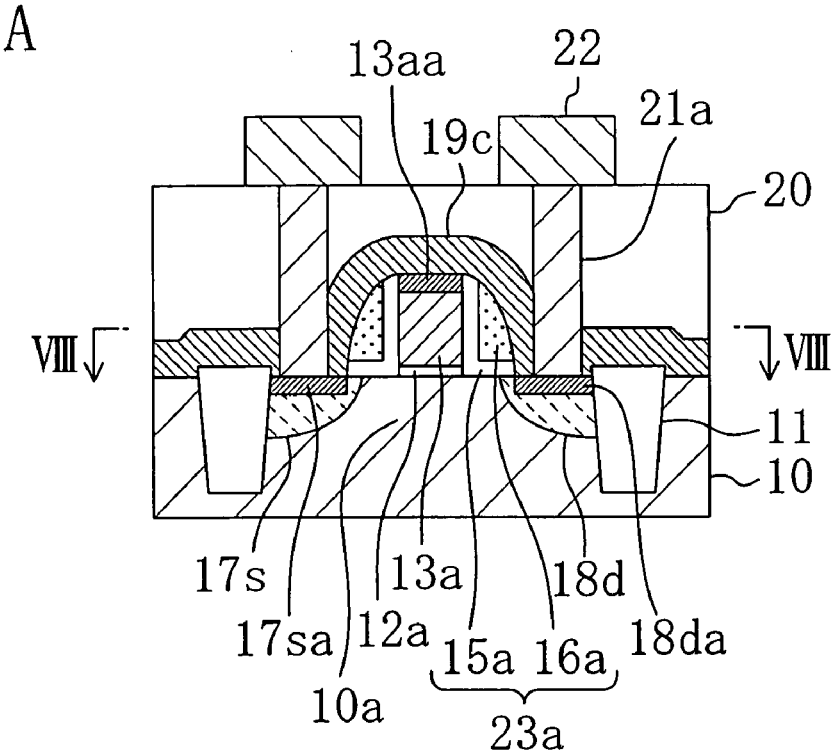
FIGS. 9A and 9B show the structure of the semiconductor device according to the second embodiment of the present invention.
Figure 9B:
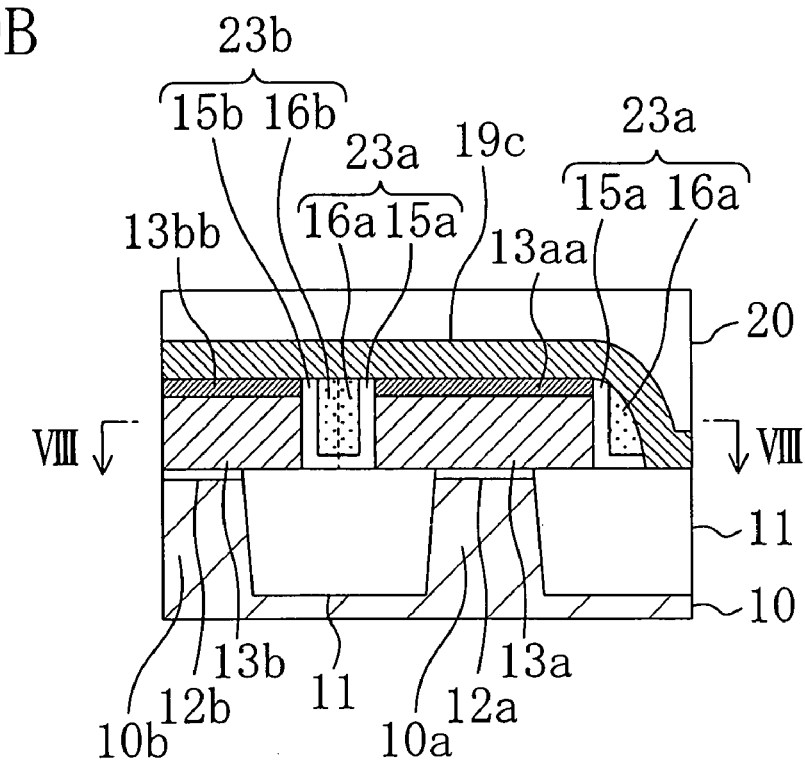

FIGS. 8, 9A, and 9B show the structure of the semiconductor device according to the second embodiment of the present invention. FIG. 8 is a plan view corresponding to the line VIII-VIII in FIGS. 9A and 9B. FIG. 9A is a sectional view corresponding to the line IXa-IXa in FIG. 8, and FIG. 9B is a sectional view corresponding to the line IXb-IXb in FIG. 8.

As shown in FIGS. 8, 9A and 9B, in the structure of the semiconductor device according to the second embodiment of the present invention, the space between the gate electrodes 13a and 13b is filled with the first side-wall insulating film 23a composed of the first sidewall 15a and the second sidewall 16a and the second side-wall insulating film 23b composed of the first sidewall 15b and the second sidewall 16b, and the filling films are formed to have an equal level to the tops of the gate electrodes 13a and 13b. Therefore, in this structure, a liner film 19c is not formed to fill the space between the gate electrodes 13a and 13b. In this point of the structure in regard to the space between the gate electrodes 13a and 13b, the device structure of the second embodiment differs from the structure of the semiconductor device according to the first embodiment in which the space therebetween is filled with the first and second side-wall insulating films 23a and 23b and the liner film 19 (see FIGS. 1, 2A, and 2B), but the other structure is identical to the structure of the semiconductor device according to the first embodiment. The liner film 19c contains internal stress producing tensile stress in the channel length direction of the active region 10a and also producing compressive stress in the channel width direction of the active region 10a.

To be more specific, as shown in FIGS. 8, 9A, and 9B, the gate electrode 13a and the gate electrode 13b are spaced apart from each other by a distance equal to or smaller than the sum total of the sum of the thicknesses of the first sidewalls 15a and 15b and the sum of the thicknesses of the second sidewalls 16a and 16b. By this arrangement, the second sidewalls 16a and 16b fill the space between the gate electrode 13a and the gate electrode 13b and then they are formed to have the same level as the tops of the gate electrodes 13a and 13b. Note that in the above description, for example, the thicknesses of the first sidewalls 15a and 15b indicate the formation thickness of the first insulating film serving as the first sidewalls 15a and 15b, and the thicknesses of the second sidewalls 16a and 16b indicate the formation thickness of the second insulating film serving as the second sidewalls 16a and 16b. In addition, before etching back of the second insulating film, the space between the gate electrode 13a and the gate electrode 13b is fully filled with the second insulating film serving as the second sidewalls 16a and 16b. Even in this situation, when the second sidewalls 16a and 16b are formed by etching back the second insulating film to expose the top surfaces of the gate electrodes 13a and 13b, the top surfaces (top ends) of the second sidewalls 16a and 16b may be formed to have a somewhat lower level than the top surfaces of the gate electrodes 13a and 13b. However, this degree of level difference causes no particular problem.

In this structure, since the liner film 19c is not formed to fill the space between the gate electrodes 13a and 13b, compressive stress applied by the liner film 19c to the protrusion of the gate electrode 13a is relieved. This provides the effect of reducing compressive stress in the channel width direction of the active region 10a applied by the liner film 19c. Moreover, a portion of the second sidewall 16a covering the protrusion of the gate electrode 13a compresses to produce compressive stress in the channel width direction of the active region 10a, but this compressive stress is compensated and relieved by compression of the second sidewall 16b formed over the side surface of the gate electrode 13b to adjoin the second sidewall 16a.

That is to say, typically, in many cases, the second sidewalls 16a and 16b are composed of a silicon nitride film with internal stress like the liner film 19c with internal stress. From this composition, for example, a portion of the second sidewall 16a covering the protrusion of the gate electrode 13a produces compressive stress in the channel width direction of the active region 10a in the same way as the influence exerted by the liner film 19 in the above-described first embodiment. However, the produced compressive stress is relieved by the second sidewall 16b formed to adjoin the second sidewall 16a.

Next description will be made of a method for fabricating a semiconductor device according to the second embodiment of the present invention.

Figure 10A:
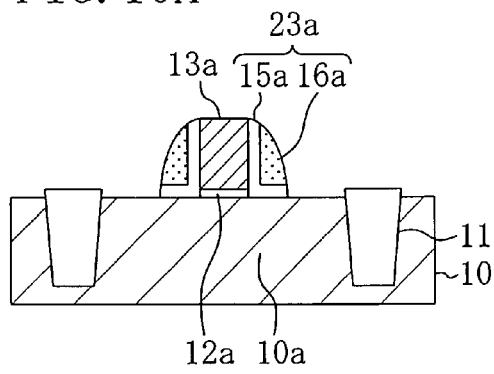
FIGS. 10A to 10F are views showing process steps of fabricating a semiconductor device according to the second embodiment of the present invention.
Figure 10B:
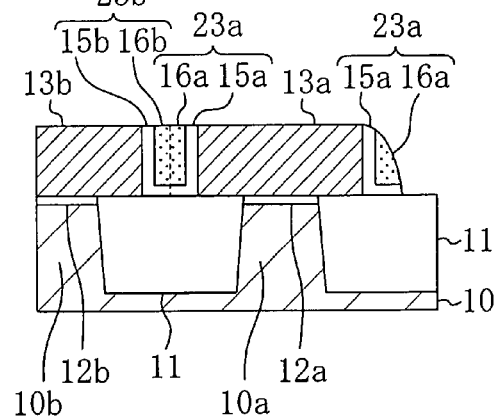
Figure 10C:
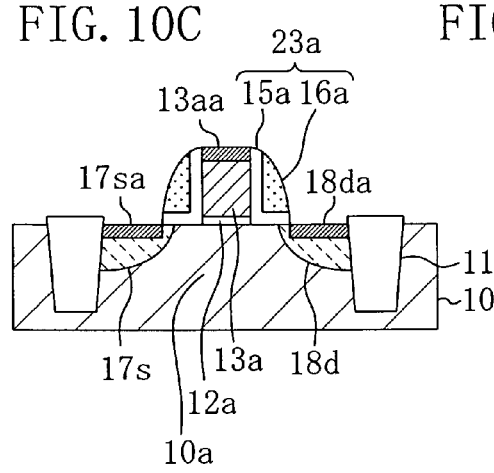
Figure 10D:
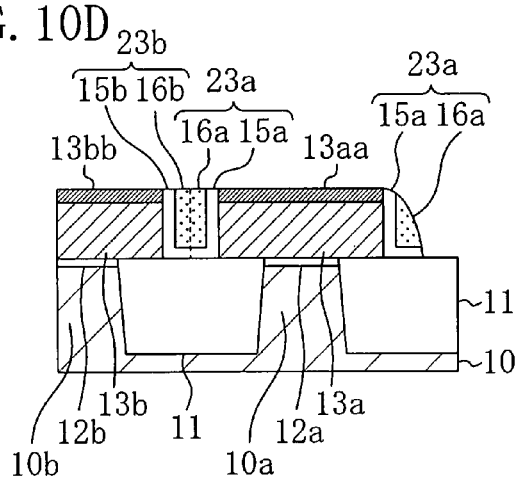
Figure 10E:
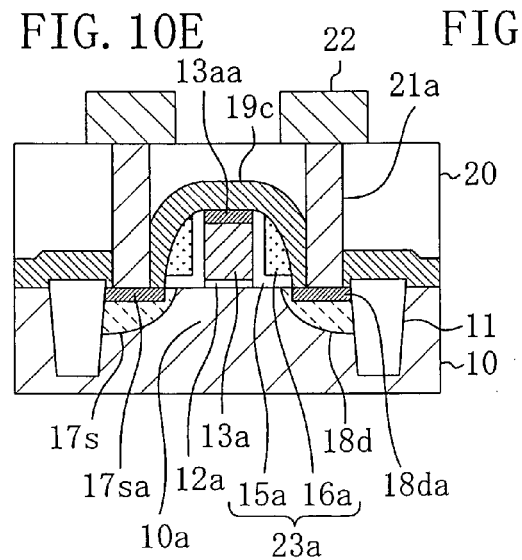

FIGS. 10A to 10F are views showing process steps of fabricating a semiconductor device according to the second embodiment of the present invention. FIGS. 10A, 10C, and 10E illustrate process steps corresponding to the cross section shown in FIG. 9A, and FIGS. 10B, 10D, and 10F illustrate process steps corresponding to the cross section shown in FIG. 9B. The following description will be made of the structure in which the field effect transistor including the gate electrode 13a is an n-type MIS transistor and the field effect transistor including the gate electrode 13b is a p-type MIS transistor.

Referring to FIGS. 10A and 10B, first, the semiconductor substrate 10 made of silicon or the like is formed with the isolation region 11 of STI defining the active regions 10a and 10b and made by filling a trench with an insulating film. Subsequently, a gate-insulating-film formation film of $SiO_2$, $Si_3N_4$, HfSiON, or the like is formed on the active regions 10a and 10b surrounded with the isolation region 11, and then a gate-electrode formation film of polysilicon or the like is formed on the gate-insulating-film formation film. By lithography and dry etching techniques, the gate insulating films 12a and 12b made of the gate-insulating-film formation film and the gate electrodes 13a and 13b made of the gate-electrode formation film are formed. In this manner, above the active region 10a, the gate electrode 13a is formed with the gate insulating film 12a interposed therebetween, and above the active region 10b, the gate electrode 13b is formed with the gate insulating film 12b interposed therebetween. In this structure, the gate electrodes 13a and 13b are adjacently disposed to have a distance equal to or smaller than the sum total of the sum of the thicknesses of the first sidewalls 15a and 15b and the sum of the thicknesses of the second sidewalls 16a and 16b. For example, in the second embodiment, considering the fact that the ends of the gate electrodes 13a and 13b are made small during etching, they are arranged to have a distance of about 80 nm or smaller. In the above description, for example, the thicknesses of the first sidewalls 15a and 15b indicate the formation thickness of the first insulating film serving as the first sidewalls 15a and 15b, and the thicknesses of the second sidewalls 16a and 16b indicate the formation thickness of the second insulating film serving as the second sidewalls 16a and 16b.

Next, using the gate electrode 13a as a mask, arsenic ions as an n-type impurity are implanted into the active region 10a on the condition of an implantation energy of 10 keV and an implantation dose of $10^{14}/cm^2$, thereby forming an n-type extension region or an LDD region (not shown). Also, using the gate electrode 13b as a mask, boron ions as a p-type impurity are implanted into the active region 10b on the condition of an implantation energy of 2 keV and an implantation dose of $10^{14}/cm^2$, thereby forming a p-type extension region or an LDD region (not shown).

Over the entire surface of the semiconductor substrate 10, a first insulating film of $SiO_2$ or the like having a thickness of about 20 nm and a second insulating film of $Si_3N_4$ having a thickness of 50 nm are sequentially formed to cover the gate electrodes 13a and 13b. Thereafter, the second insulating film and the first insulating film are sequentially etched back to form the first sidewalls 15a and 15b made of the first insulating film and the second sidewalls 16a and 16b made of the second insulating film. In this manner, on the side surface of the gate electrode 13a, the first side-wall insulating film 23a is formed which is composed of: the first sidewall 15a with an L-shaped cross section; and the second sidewall 16a formed to cover the L-shaped inner surface (the bottom and side surfaces) of the first sidewall 15a. Simultaneously with this, on the side surface of the gate electrode 13b, the second side-wall insulating film 23b is formed which is composed of: the first sidewall 15b with an L-shaped cross section; and the second sidewall 16b formed to cover the L-shaped inner surface (the bottom and side surfaces) of the first sidewall 15b. In the structure after formation of the side-wall insulating films, the distance between the gate electrode 13a and the gate electrode 13b is 80 nm, whereas the sum total of the sum of the thicknesses of the first sidewalls 15a and 15b (20 nm+20 nm=40 nm) and the sum of the thicknesses of the second sidewalls 16a and 16b (50 nm+50 nm=100 nm) is 140 nm. By this structure, the space between the gate electrode 13a and the gate electrode 13b is filled with the first sidewalls 15a and 15b and the second sidewalls 16a and 16b and the filling films are formed to have an equal level to the top surfaces of the gate electrodes 13a and 13b.

Next, in the step shown in FIGS. 10C and 10D, using the gate electrode 13a and the first side-wall insulating film 23a as a mask, arsenic ions as an n-type impurity are implanted into a portion of the active region 10a located outside the first side-wall insulating film 23a on the condition of an implantation energy of 10 keV and an implantation dose of $10^{15}/cm^2$, thereby forming n-type high-concentration impurity regions serving as the source region 17s and the drain region 18d, respectively. Also, using the gate electrode 13b and the second side-wall insulating film 23b as a mask, boron ions as a p-type impurity are implanted into a portion of the active region 10b located outside the second side-wall insulating film 23b on the condition of an implantation energy of 2 keV and an implantation dose of $10^{15}/cm^2$, thereby forming p-type high-concentration impurity regions serving as source and drain regions (not shown), respectively.

Over the entire surface of the semiconductor substrate 10, a metal film of cobalt, nickel, or the like is deposited to have a thickness of about 50 nm, and then a thermal treatment is performed to allow silicon to react with metal contained in the metal film. Thereby, the silicide layer 17sa and the silicide layer 18da are formed in the top portions of the source region 17s and the drain region 18d located outside the first side-wall insulating film 23a, respectively, and the silicide layer 13aa is formed in the top portion of the gate electrode 13a. Simultaneously with this, the silicide layer 17sb and the silicide layer 18db (see FIG. 8) are formed in the top portions of the source region and the drain region located outside the second side-wall insulating film 23b, respectively, and the silicide layer 13bb is formed in the top portion of the gate electrode 13b.

Figure 10F:
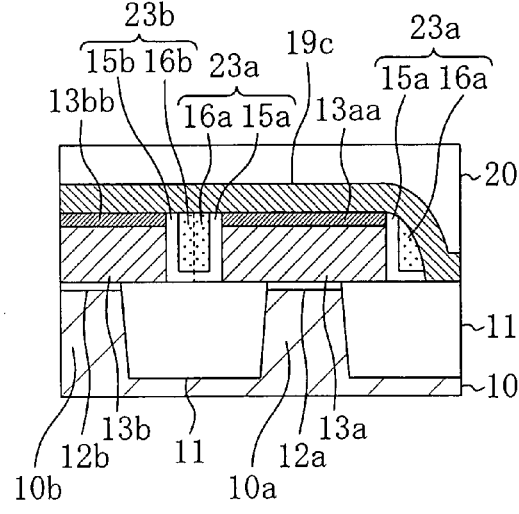

Next, in the step shown in FIGS. 10E and 10F, over the entire surface of the semiconductor substrate 10, the liner film 19c of, for example, a silicon nitride film serving as a stress-containing insulating film containing internal stress is deposited to cover the gate electrodes 13a and 13b, the first side-wall insulating film 23a, and the second side-wall insulating film 23b. The liner film 19c is formed by an LP-CVD method or the like to have a thickness of about 30 nm. Subsequently, on the liner film 19c, the interlayer insulating film 20 of, for example, a silicon oxide film is deposited to have a thickness of about 500 nm, and then the surface of the deposited film is planarized by CMP. Using a photoresist pattern as a mask, contact holes penetrating the interlayer insulating film 20 and the liner film 19c are formed by dry etching with a gas such as $CF_4$, and then the contact holes are filled with metal such as tungsten to form the contact plugs 21a and 21b (see FIG. 8). Thereby, in the n-type MIS transistor, the source region 17s is electrically connected through the silicide layer 17sa to the contact plug 21a, and the drain region 18d is connected through the silicide layer 18*da* to the contact plug 21*a*. Also, in the p-type MIS transistor, the source region is electrically connected through the silicide layer 17*sb* to the contact plug 21*b*, and the drain region is connected through the silicide layer 18*db* to the contact plug 21*b*. Thereafter, on the interlayer insulating film 20, a conductive film of aluminum or the like is deposited to have a thickness of about 100 nm, and then the deposited conductive film is patterned to form the interconnect 22 connected to the contact plug 21*a* and an interconnect (not shown) connected to the contact plug 21*b*.

With the above-described method for fabricating a semiconductor device according to the second embodiment of the present invention, the structure of the semiconductor device shown with FIGS. 8, 9A, and 9B and the effects exerted by this structure can be provided.

—First Modification of Second Embodiment—

Figure 11:
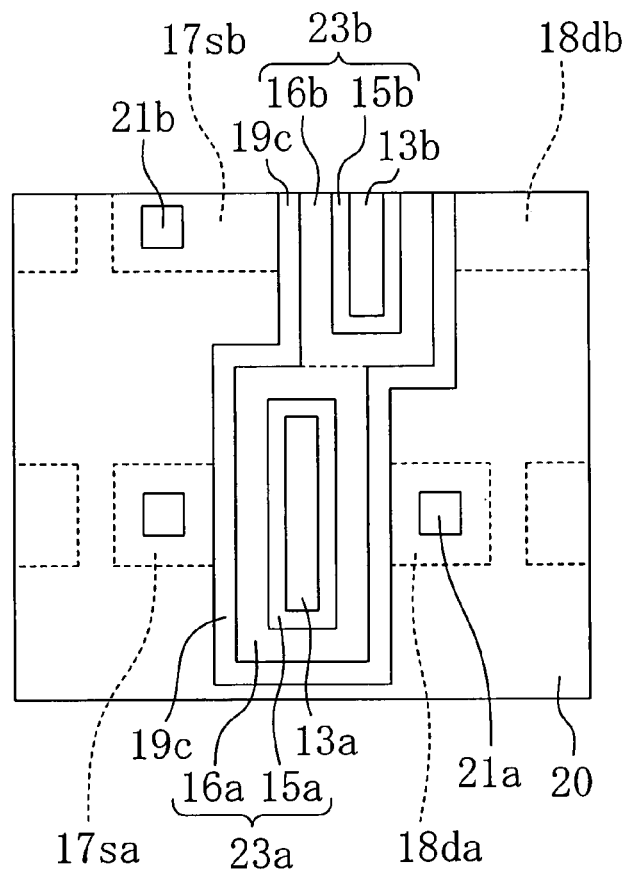
FIG. 11 is a plan view showing the structure of a semiconductor device according to a first modification of the second embodiment of the present invention.

FIG. 11 is a plan view showing a semiconductor device having a structure in which in the structure of the semiconductor device shown in FIG. 8, the gate electrode 13*b* is shifted in the gate length direction.

As described in the first modification of the first embodiment, for a typical semiconductor device, there may be the case where the gate electrode 13*a* and the gate electrode 13*b* cannot be arranged to face each other and thus as shown in FIG. 11, they are disposed closely but in shifted relation. Even in such a case, if the gate electrode 13*a* and the gate electrode 13*b* are arranged so that the space therebetween is filled with the first sidewalls 15*a* and 15*b* and the second sidewalls 16*a* and 16*b* and the filling sidewalls are formed to have an equal level to the tops of the gate electrodes 13*a* and 13*b*, the effect of reducing compressive stress in the channel width direction of the active region 10*a*, which is applied by the portion of the second sidewall 16*a* formed over the side surface of the protrusion of the gate electrode 13*a*, can be exerted. That is to say, if the amount of shift of the gate electrode 13*b* in the gate length direction relative to the gate electrode 13*a* is within an extent such that the portion of the second sidewall 16*a* formed over the side surface of the gate electrode 13*a* and the portion of the second sidewall 16*b* formed over the side surface of the gate electrode 13*b* at least partly overlap in the gate length direction, the effects as described above can be provided.

—Second Modification of Second Embodiment—

Figure 12:
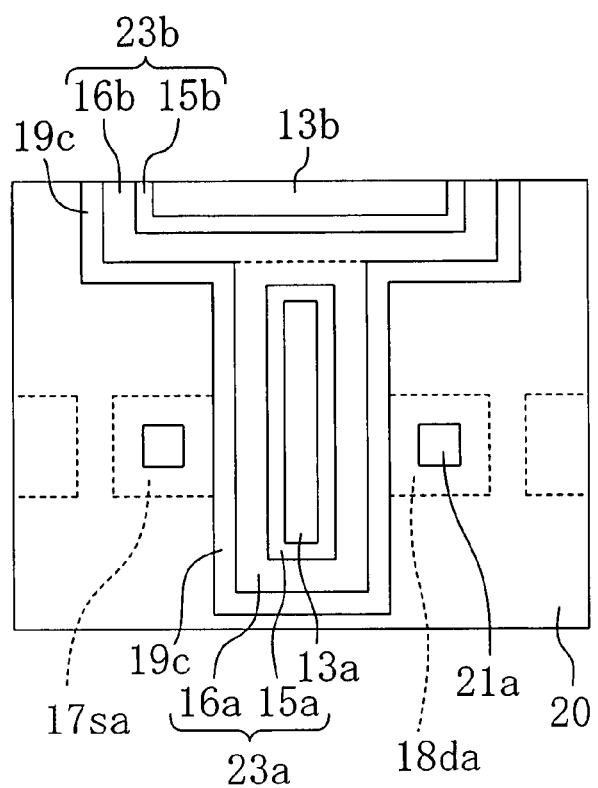
FIG. 12 is a plan view showing the structure of a semiconductor device according to a second modification of the second embodiment of the present invention.

Furthermore, as in the case of the above-described second modification of the first embodiment, for a typical semiconductor device, there may be the case where as shown in FIG. 12, the gate electrodes 13*b* and 13*a* are closely arranged so that the side surface of the gate electrode 13*b* in the gate width direction faces the side surface of the gate electrode 13*a* in the gate length direction and thus the gate width of the gate electrode 13*b* is greater than the gate length of the gate electrode 13*a*. Even in such a case, if the gate electrode 13*a* and the gate electrode 13*b* are arranged so that the space therebetween is filled with the first sidewalls 15*a* and 15*b* and the second sidewalls 16*a* and 16*b* and the filling sidewalls are formed to have an equal level to the tops of the gate electrodes 13*a* and 13*b*, the effect of reducing compressive stress in the channel width direction of the active region 10*a*, which is applied by the portion of the second sidewall 16*a* formed over the side surface of the protrusion of the gate electrode 13*a*, can be exerted.

—Third Modification of Second Embodiment—

Figure 13:
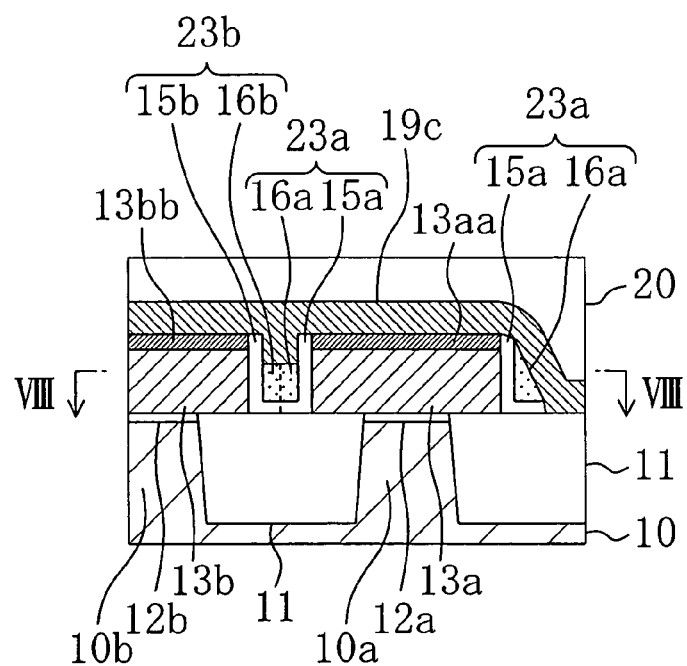
FIG. 13 is a sectional view showing the structure of a semiconductor device according to a third modification of the second embodiment of the present invention.

In the second embodiment shown above, description has been made of the case where the space between the gate electrode 13*a* and the gate electrode 13*b* is filled with the first sidewalls 15*a* and 15*b* and the second sidewalls 16*a* and 16*b* and the filling sidewalls are formed to have an equal level to the top surfaces of the gate electrodes 13*a* and 13*b*. In contrast to this, in the third modification, as shown in FIG. 13, the top surfaces of the second sidewalls 16*a* and 16*b* filling the space between the first and second side-wall insulating films 23*a* and 23*b* have lower levels than the top surfaces of the gate electrodes 13*a* and 13*b*, and the upper area above the second sidewalls are filled with the liner film 19*c*. In this structure, the portion of the liner film 19*c* filling the space between the first and second side-wall insulating films 23*a* and 23*b* has a greater thickness than the deposition thickness of the liner film 19*c* (for example, the thickness of a portion of the liner film 19*c* formed on the isolation region 11 spaced apart in the gate length direction from the first side-wall insulating film 23*a*). Even in such a structure, the effect of reducing compressive stress in the channel width direction of the active region 10*a* can be provided. Note that the structure in the third modification is designed to have the same structure as the structure in the second embodiment except for the levels of the second sidewalls 16*a* and 16*b* formed in the space between the first and second side-wall insulating films 23*a* and 23*b*.

(Third Embodiment)

A semiconductor device and its fabrication method according to a third embodiment of the present invention will now be described.

Figure 14:
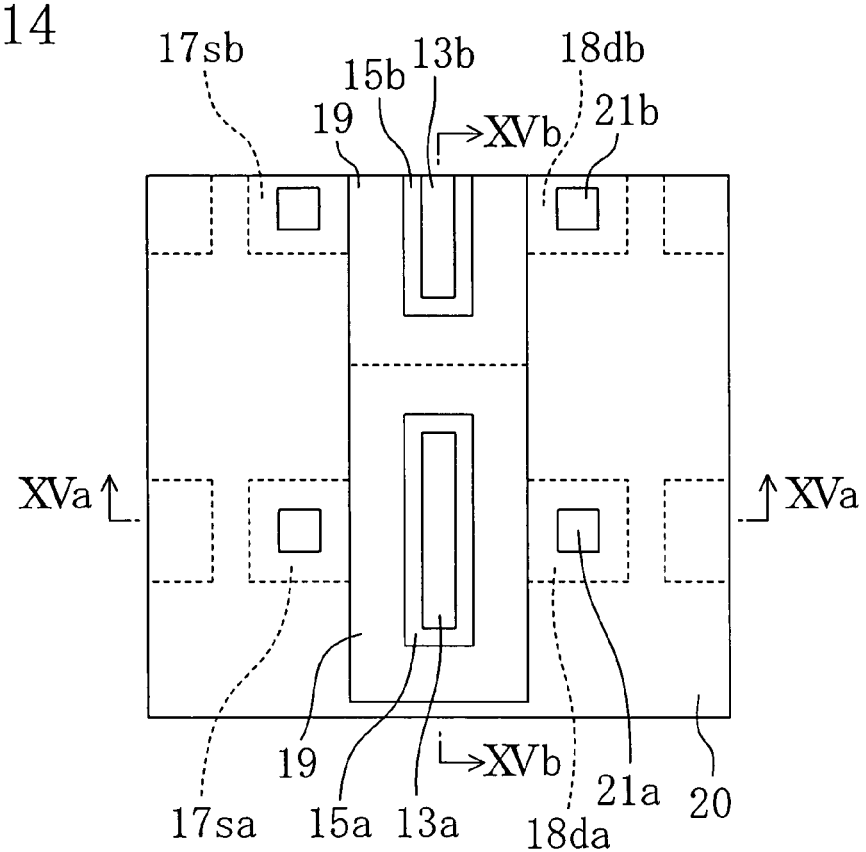
FIG. 14 is a plan view showing the structure of a semiconductor device according to a third embodiment of the present invention and corresponding to the line XIV-XIV in FIGS. 15A and 15B.
Figure 15A:
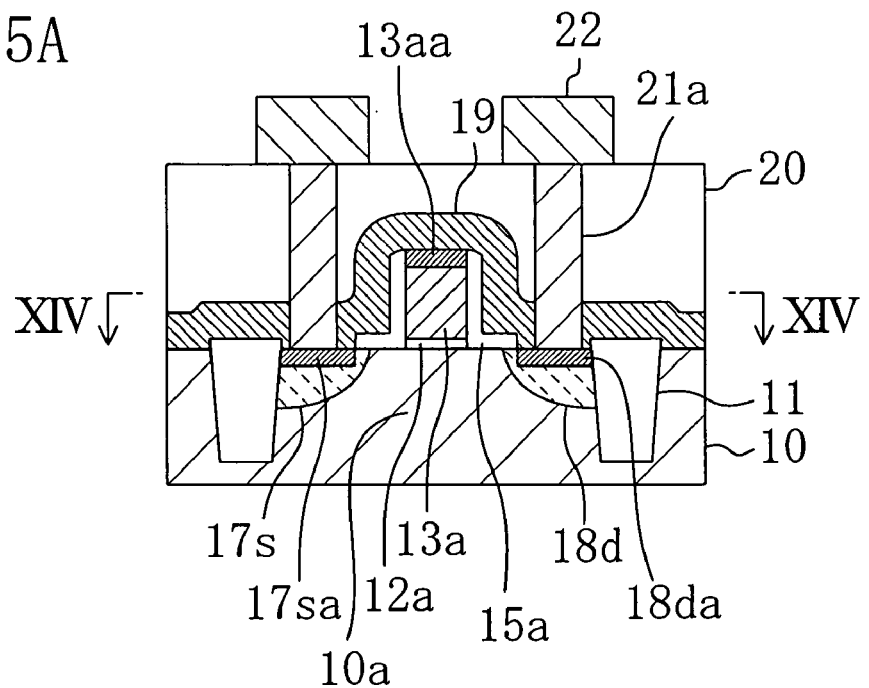
FIGS. 15A and 15B show the structure of the semiconductor device according to the third embodiment of the present invention.
Figure 15B:
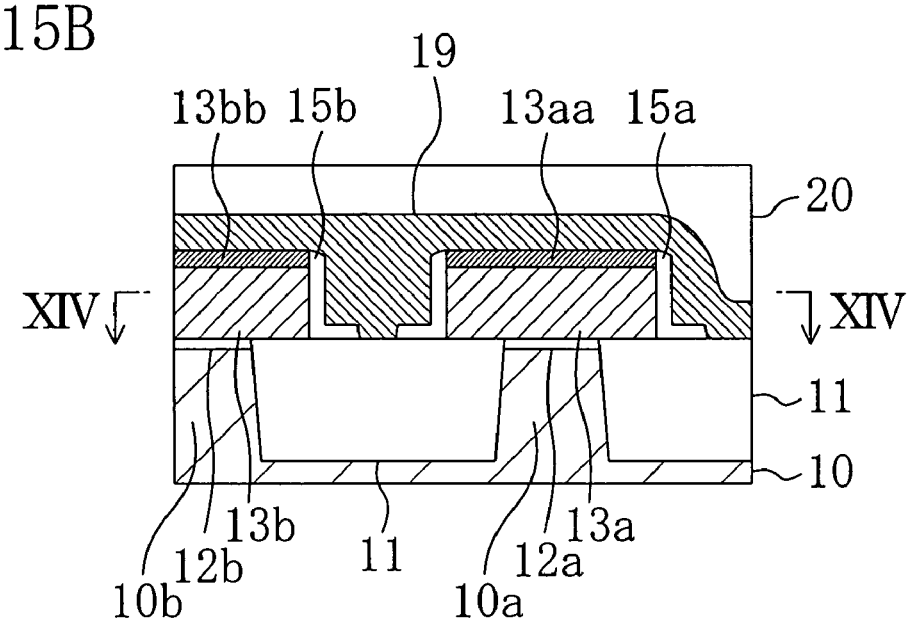

FIGS. 14, 15A, and 15B show the structure of the semiconductor device according to the third embodiment of the present invention. FIG. 14 is a plan view corresponding to the line XIV-XIV in FIGS. 15A and 15B. FIG. 15A is a sectional view corresponding to the line XVa-XVa in FIG. 14, and FIG. 15B is a sectional view corresponding to the line XVb-XVb in FIG. 14.

First, referring to the sectional view in FIG. 15A illustrated across the gate length direction, a semiconductor substrate 10 made of silicon is formed with an isolation region 11 of STI (shallow trench isolation) defining an active region 10*a* and made by filling a trench with an insulating film. Above the active region 10*a* surrounded with the isolation region 11, a gate electrode 13*a* having a silicide layer 13*aa* in its top-layer portion is formed with a gate insulating film 12*a* interposed therebetween. The side surfaces of the gate electrode 13*a* and the silicide layer 13*aa* are formed with a first sidewall 15*a* having an L-shaped cross section. Regions of the active region 10*a* located outside the first sidewall 15*a* are formed with a source region 17*s* having a silicide layer 17*sa* in its top-layer portion and a drain region 18*d* having a silicide layer 18*da* in its top-layer portion, respectively.

Over the semiconductor substrate 10, a liner film 19 as a stress-containing insulating film containing internal stress is formed to cover the gate electrode 13*a*, the first sidewall 15*a*, and the like. The liner film 19 is formed to come into contact with the L-shaped inner surface (the bottom and side surfaces) of the first sidewall 15*a*. The top of the liner film 19 is formed with an interlayer insulating film 20. The interlayer insulating film 20 is formed with contact plugs 21*a* which penetrate the interlayer insulating film 20 and the liner film 19 to reach the silicide layer 17*sa* and the silicide layer 18*da*, respectively. The top of the interlayer insulating film 20 is formed with interconnects 22 whose bottom surfaces are connected to the top ends of the contact plugs 21*a*, respectively. Note that portions of the active region 10*a* located below both sides of the gate electrode 13*a* are formed with extension regions or LDD regions (not shown) connected to the source region 17*s* and the drain region 18*d*, respectively.

Next, in the sectional view in FIG. 15B illustrated across the gate width direction, the semiconductor substrate 10 is formed with the isolation region 11 defining the active regions 10*a* and 10*b*. Above the active region 10*a* surrounded with the isolation region 11 (and also on part of the isolation region 11), the gate electrode 13a having the silicide layer 13aa in its top-layer portion is formed with the gate insulating film 12a interposed therebetween. The gate electrode 13a has protruding portions which protrude on the isolation regions 11 formed on the both sides thereof, respectively, to interpose the active region 10a. Above the active region 10b surrounded with the isolation region 11, a gate electrode 13b having a silicide layer 13bb in its top-layer portion is formed with a gate insulating film 12b interposed therebetween. The gate electrode 13b has protruding portions which protrude on the isolation regions 11 formed on the both sides thereof, respectively, to interpose the active region 10b. The first and second gate electrodes 13a and 13b may be made of the same material or different materials. The side surfaces of the gate electrode 13a and the silicide layer 13aa are formed with the first sidewall 15a having an L-shaped cross section, and the side surfaces of the gate electrode 13b and the silicide layer 13bb are formed with the first sidewall 15b having an L-shaped cross section. Although not shown in FIG. 15B, portions of the active region 10b located outside the first sidewall 15b are formed with a source region and a drain region which are connected through contact plugs 21b (see FIG. 14) to interconnects (not shown), respectively, as in the case of the sectional view in FIG. 15A. As shown in FIG. 14, the source region has a silicide layer 17sb (see FIG. 14) in its top-layer portion, and the drain region has a silicide layer 18db in its top-layer portion.

Over the semiconductor substrate 10, the liner film 19 of a silicon nitride film or the like containing internal stress is formed to cover the gate electrodes 13a and 13b, the first sidewalls 15a and 15b, and the like. The liner film 19 contains internal stress producing tensile stress in the channel length direction of the active region 10a and also producing compressive stress in the channel width direction of the active region 10a. The top of the liner film 19 is formed with the interlayer insulating film 20.

In FIGS. 14, 15A, and 15B, description has been made of the structure in which only the first sidewalls 15a and 15b having L-shaped cross sections are present. Alternatively, it is also acceptable that in addition to the first sidewalls 15a and 15b, a sidewall (an offset spacer) having an I-shaped (plate-like) cross section is formed between the gate electrodes 13a and 13b and the associated first sidewalls 15a and 15b. The liner film 19 may be formed of a single layer or multiple layers.

In this structure, as shown in FIGS. 14 and 15B, the liner film 19 is formed to enclose a combination of the gate electrode 13a and the first sidewall 15a and a combination of the gate electrode 13b and the first sidewall 15b. Also, the first sidewall 15a and the first sidewall 15b are spaced apart from each other, and the liner film 19 is formed to fill the space therebetween. Furthermore, the top surface of a portion of the liner film 19 filling this space is formed to have an equal level to or a higher level than the top surfaces of the first and second gate electrodes 13a and 13b.

The semiconductor device with the above-described structure according to the third embodiment of the present invention differs from the structure of the semiconductor device according to the first embodiment in that the second sidewalls 16a and 16b (see, for example, FIG. 1) are not formed. However, even in this structure, compressive stress in the channel width direction (the gate width direction) of the active region 10a can be relieved which is applied by a portion of the liner film 19 formed over the protruding portion of the gate electrode 13a (the protrusion of the gate electrode 13a) protruding from the active region 10a onto the isolation region 11 closer to the active region 10b.

To be more specific, as mentioned above, the liner film 19 is formed to fill the space between the first sidewall 15a and the first sidewall 15b and to have an equal level to or a higher level than the top surfaces of the gate electrodes 13a and 13b. With this structure, compressive stress in the channel width direction applied by compression of a portion of the liner film 19 covering the protrusion of the gate electrode 13a is compensated and relieved by simultaneous compression of a portion of the liner film 19 covering the gate electrode 13b and the first sidewall 15b. From the same reason, compressive stress in the channel width direction (the gate width direction) of the active region 10b can also be relieved which is applied by a portion of the liner film 19 formed over the protruding portion of the gate electrode 13b (the protrusion of the gate electrode 13b) protruding from the active region 10b onto the isolation region 11 closer to the active region 10a. In addition, in the case like the third embodiment where the structure in which the second sidewall is not formed is employed to the conventional semiconductor device, an increased degree of the carrier-mobility enhancement effect will be cancelled which is exerted by tensile stress in the channel length direction of the channel region applied by the insulating film with internal stress. However, with the third embodiment, an excellent carrier mobility can be provided like the first and second embodiments.

Furthermore, if the distance between the gate protrusions in the device according to the third embodiment of the present invention is equal to or smaller than the sum total of the double of the thickness of the liner film 19 and the sum of the thicknesses of the first sidewalls 15a and 15b, the liner film 19 can be formed to fill the space between the first sidewall 15a and the first sidewall 15b and to have an equal level to or a higher level than the top surfaces of the gate electrodes 13a and 13b. In this description, for example, the thicknesses of the first sidewalls 15a and 15b indicate the formation thickness of a first insulating film serving as the first sidewalls 15a and 15b.

The above description has been made of the case where the gate electrode 13b constitutes the field effect transistor. Alternatively, the case where it does not constitute the field effect transistor may be employed. Even in this case, if it is designed to satisfy the above-shown condition of the distance between the gate protrusions, the same effects as the effect described above can be provided.

In the third embodiment, description has been made of the case where for an auxiliary pattern for relieving stress on the gate electrode 13a, the gate electrode 13b of the adjacent transistor is used. However, the auxiliary pattern is not limited to this, and it is sufficient to use an auxiliary pattern with the same level as the gate electrode 13a. As the auxiliary pattern, for example, use may be made of: a dummy gate electrode, an interconnect pattern, or a resistor pattern provided in the manner in which a film of the same material as the gate electrode 13a is patterned simultaneously with patterning of the gate electrode 13a; or a dummy pattern provided by patterning a film of a different material from the gate electrode 13a. It is acceptable that the auxiliary pattern is formed only on the isolation region or only on a portion of the semiconductor substrate surrounded with the isolation region. Or, it is also acceptable that it is formed to extend from the isolation region onto the portion of the semiconductor substrate surrounded with the isolation region. In addition, the gate electrode 13b as the auxiliary pattern is disposed beside only one of the protrusions of the gate electrode 13a, but the auxiliary pattern may be disposed beside the both protrusions of the gate electrode 13a. If the auxiliary pattern is used only to relieve stress on the gate electrode 13a, it is sufficient that the auxiliary pattern has a length in the gate width direction of about 0.1 μm and a length in the gate length direction equal to or more than the width of the gate electrode 13a in the gate length direction.

The conductivity type of the field effect transistor including the gate electrode 13a may be p-type or n-type. Also in the case where the gate electrode 13b constitutes a field effect transistor, its conductivity may be p-type or n-type.

Next description will be made of a method for fabricating a semiconductor device according to the third embodiment of the present invention.

Figure 16A:
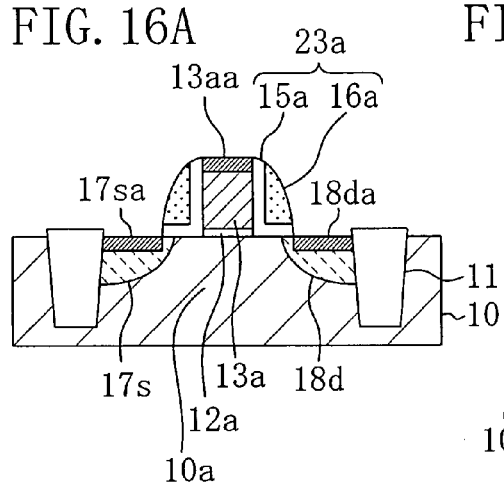
FIGS. 16A to 16F are views showing process steps of fabricating a semiconductor device according to the third embodiment of the present invention.
Figure 16B:
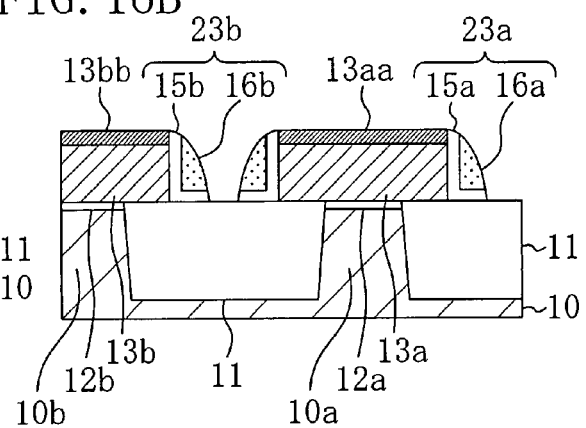
Figure 16C:
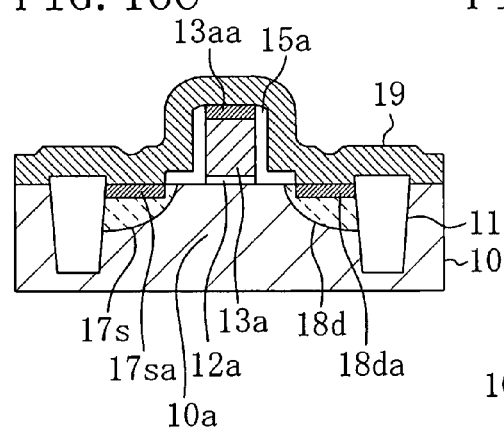
Figure 16D:
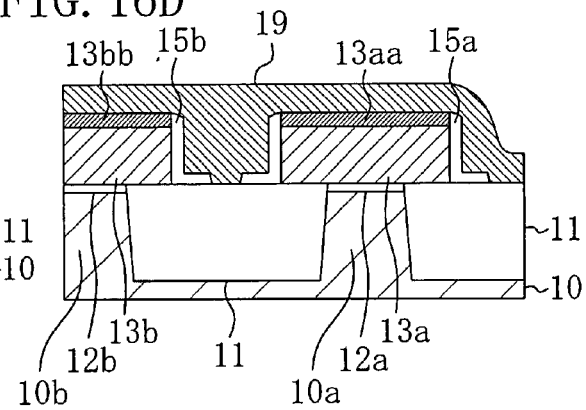
Figure 16E:
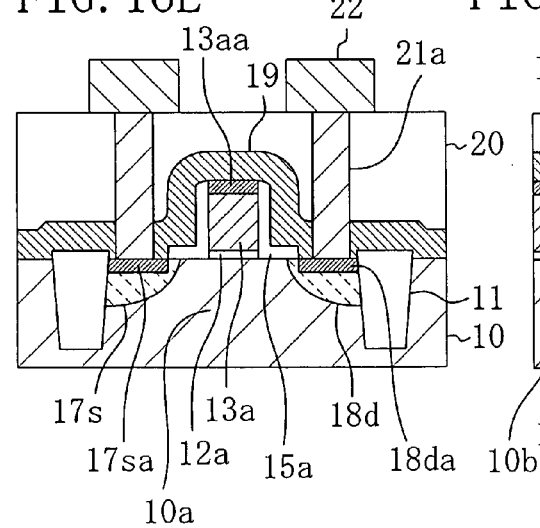

FIGS. 16A to 16F are views showing process steps of fabricating a semiconductor device according to the third embodiment of the present invention. FIGS. 16A, 16C, and 16E illustrate process steps corresponding to the cross section shown in FIG. 15A, and FIGS. 16B, 16D, and 16F illustrate process steps corresponding to the cross section shown in FIG. 15B. The following description will be made of the structure in which the field effect transistor including the gate electrode 13a is an n-type MIS transistor and the field effect transistor including the gate electrode 13b is a p-type MIS transistor.

Referring to FIGS. 16A and 16B, first, the semiconductor substrate 10 made of silicon or the like is formed with the isolation region 11 of STI defining the active regions 10a and 10b and made by filling a trench with an insulating film. Subsequently, a gate-insulating-film formation film of SiO$_2$, SiON, HfSiON, or the like is formed on the active regions 10a and 10b surrounded with the isolation region 11, and then a gate-electrode formation film of polysilicon or the like is formed on the gate-insulating-film formation film. By lithography and dry etching techniques, the gate insulating films 12a and 12b made of the gate-insulating-film formation film and the gate electrodes 13a and 13b made of the gate-electrode formation film are formed. In this manner, above the active region 10a, the gate electrode 13a is formed with the gate insulating film 12a interposed therebetween, and above the active region 10b, the gate electrode 13b is formed with the gate insulating film 12b interposed therebetween. Although in this method the gate electrodes 13a and 13b are made of the same material, they can also be made of different materials. In this structure, the gate electrodes 13a and 13b are adjacently disposed to have a distance equal to or smaller than the sum total of the double of the thickness of the liner film 19 to be described later and the sum of the thicknesses of the first sidewalls 15a and 15b to be described later. For example, in the third embodiment, considering the fact that the ends of the gate electrodes 13a and 13b are made small during etching, they are arranged to have a distance of about 200 nm or smaller. In this description, for example, the thicknesses of the first sidewalls 15a and 15b indicate the formation thickness of a first insulating film serving as the first sidewalls 15a and 15b.

Next, using the gate electrode 13a as a mask, arsenic ions as an n-type impurity are implanted into the active region 10a on the condition of an implantation energy of 10 keV and an implantation dose of $10^{14}/cm^2$, thereby forming an n-type extension region or an LDD region (not shown). Also, using the gate electrode 13b as a mask, boron ions as a p-type impurity are implanted into the active region 10b on the condition of an implantation energy of 2 keV and an implantation dose of $10^{14}/cm^2$, thereby forming a p-type extension region or an LDD region (not shown).

Over the entire surface of the semiconductor substrate 10, a first insulating film of SiO$_2$ or the like having a thickness of about 20 mm and a second insulating film of Si$_3$N$_4$ having a thickness of about 50 nm are sequentially formed to cover the gate electrodes 13a and 13b. Thereafter, the second insulating film and the first insulating film are sequentially etched back to form the first sidewalls 15a and 15b made of the first insulating film and the second sidewalls 16a and 16b made of the second insulating film. In this manner, on the side surface of the gate electrode 13a, the first side-wall insulating film 23a is formed which is composed of: the first sidewall 15a with an L-shaped cross section; and the second sidewall 16a formed to cover the L-shaped inner surface (the bottom and side surfaces) of the first sidewall 15a. Simultaneously with this, on the side surface of the gate electrode 13b, the second side-wall insulating film 23b is formed which is composed of: the first sidewall 15b with an L-shaped cross section; and the second sidewall 16b formed to cover the L-shaped inner surface (the bottom and side surfaces) of the first sidewall 15b.

Next, using the gate electrode 13a and the first side-wall insulating film 23a as a mask, arsenic ions as an n-type impurity are implanted into a portion of the active region 10a located outside the first side-wall insulating film 23a on the condition of an implantation energy of 10 keV and an implantation dose of $10^{15}/cm^2$, thereby forming n-type high-concentration impurity regions serving as the source region 17s and the drain region 18d, respectively. Also, using the gate electrode 13b and the second side-wall insulating film 23b as a mask, boron ions as a p-type impurity are implanted into a portion of the active region 10b located outside the second side-wall insulating film 23b on the condition of an implantation energy of 2 keV and an implantation dose of $10^{15}/cm^2$, thereby forming p-type high-concentration impurity regions serving as source and drain regions (not shown), respectively.

Over the entire surface of the semiconductor substrate 10, a metal film of cobalt, nickel, or the like is deposited to have a thickness of about 50 nm, and then a thermal treatment is performed to allow silicon to react with metal contained in the metal film. Thereby, the silicide layer 17sa and the silicide layer 18da are formed in the top portions of the source region 17s and the drain region 18d located outside the first side-wall insulating film 23a, respectively, and the silicide layer 13aa is formed in the top portion of the gate electrode 13a. Simultaneously with this, the silicide layer 17sb and the silicide layer 18db (see FIG. 1) are formed in the top portions of the source region and the drain region located outside the second sidewall insulating film 23b, respectively, and the silicide layer 13bb is formed in the top portion of the gate electrode 13b.

Next, in the step shown in FIGS. 16C and 16D, the second sidewall 16a constituting the first side-wall insulating film 23a and the second sidewall 16b constituting the second side-wall insulating film 23b are selectively removed by, for example, wet etching with hot phosphoric acid. Thus, the resulting first side-wall insulating film 23a is composed of only the L-shaped first sidewall 15a, and the resulting second side-wall insulating film 23b is composed of only the L-shaped first sidewall 15b. In the fabrication method of the third embodiment, the second sidewalls 16a and 16b are removed after formation of the silicide layers 17sa, 18da, 13aa, and 13bb in the step shown in FIGS. 16A and 16B. However, alternative procedure may be employed in which after formation of the source region 17s and the drain region 18d (including source and drain regions that are not shown) in the step shown in FIGS. 16A and 16B, the second sidewalls 16a and 16b are removed and then the silicide layers 17sa, 18da, 13aa, and 13bb are formed. Subsequently, over the entire surface of the semiconductor substrate 10, the liner film 19 of a silicon nitride film or the like as a stress-containing insulating film containing internal stress is deposited to cover the gate electrodes 13a and 13b and the first sidewalls 15a and 15b. The liner film 19 is formed by, for example, an LP-CVD method to have a thickness of about 100 nm. In this formation, the liner film 19 is formed to come into contact with the L-shaped inner surfaces (the bottom and side surfaces) of the first sidewalls 15a and 15b. The distance between the gate electrode 13a and the gate electrode 13b is about 200 nm or smaller as described above, whereas the sum total of the double of the thickness of the liner film 19 (100 nm×2=200 nm) and the sum of the thicknesses of the first sidewalls 15a and 15b (20 nm+20 nm=40 nm) is 240 nm. Therefore, the liner film 19 fills the space between the first sidewall 15a and the second sidewall 15b and then is formed so that the top surface thereof has an equal level to or a higher level than the top surfaces of the gate electrodes 13a and 13b.

Figure 16F:
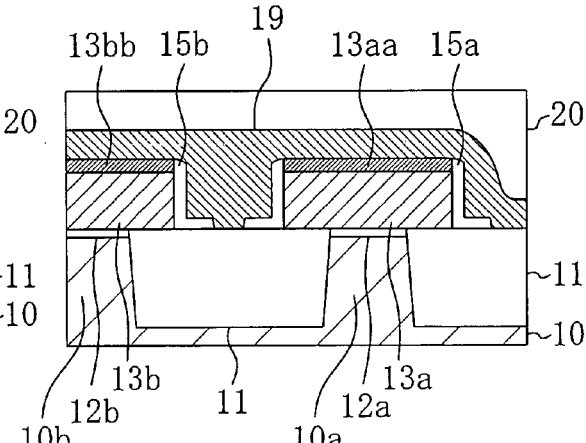
Figure 17:
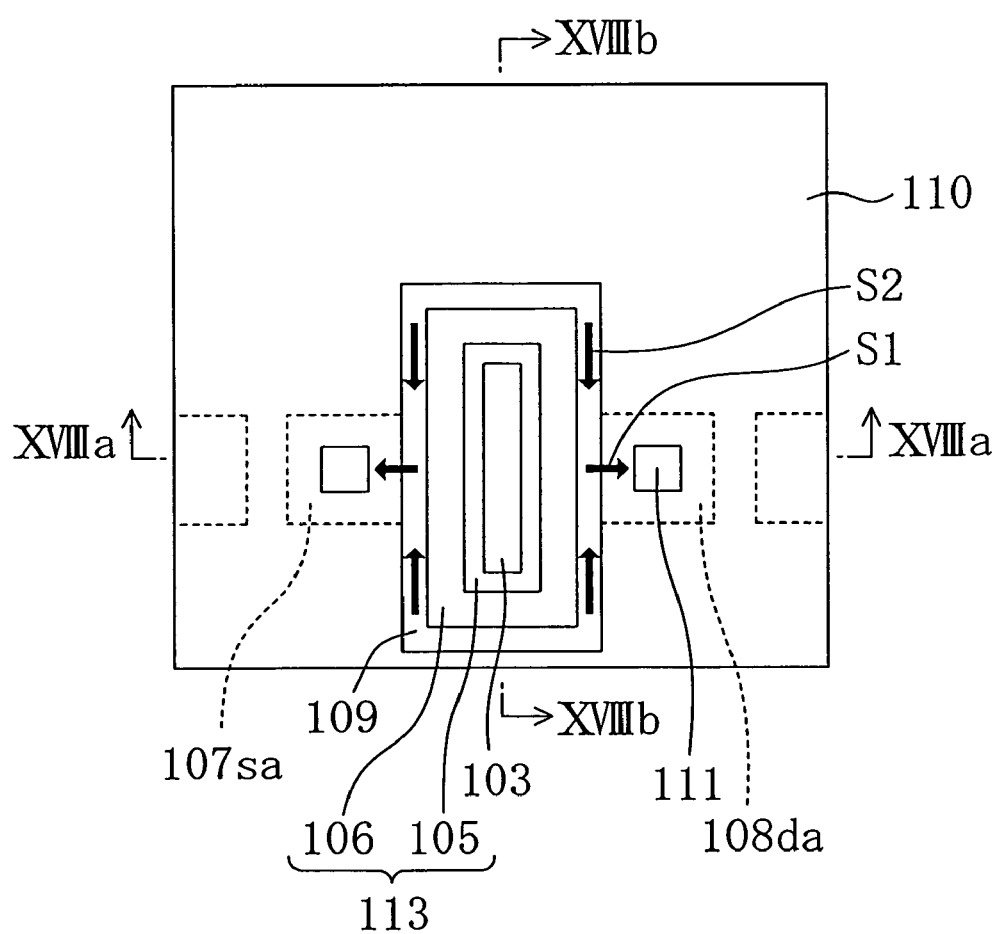
FIG. 17 is a plan view showing a conventional semiconductor device and corresponding to the line XVII-XVII in FIGS. 18A and 18B.
Figure 18A:
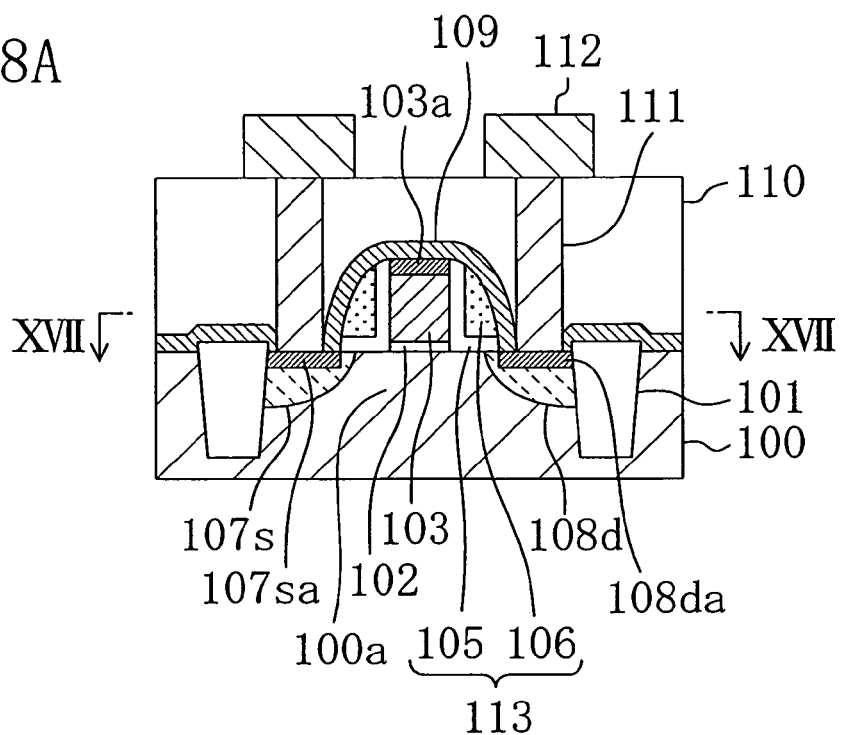
FIGS. 18A and 18B show the conventional semiconductor device.
Figure 18B:
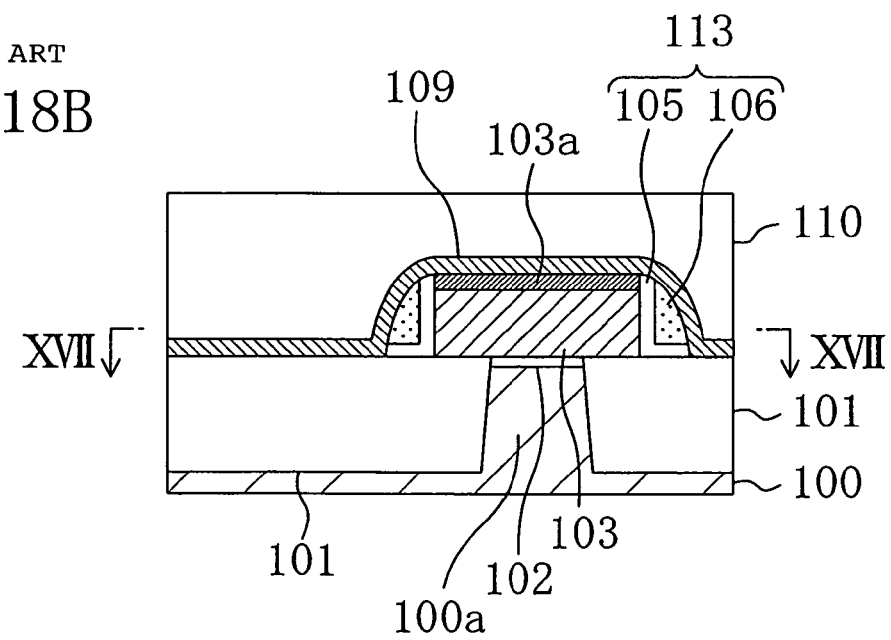

Subsequently, in the step shown in FIGS. 16E and 16F, on the liner film 19, the interlayer insulating film 20 of, for example, a silicon oxide film is deposited to have a thickness of about 500 nm, and then the surface of the deposited film is planarized by CMP. Using a photoresist pattern (not shown) as a mask, contact holes penetrating the interlayer insulating film 20 and the liner film 19 are formed by dry etching with a gas such as $CF_4$, and then the contact holes are filled with metal such as tungsten to form the contact plugs 21a and 21b (see FIG. 1). Thereby, in the n-type MIS transistor, the source region 17s is electrically connected through the silicide layer 17sa to the contact plug 21a, and the drain region 18d is connected through the silicide layer 18da to the contact plug 21a. Also, in the p-type MIS transistor, the source region is electrically connected through the silicide layer 17sb to the contact plug 21b, and the drain region is connected through the silicide layer 18db to the contact plug 21b. Thereafter, on the interlayer insulating film 20, a conductive film of aluminum or the like is deposited to have a thickness of about 100 nm, and then the deposited conductive film is patterned to form the interconnect 22 connected to the contact plug 21a and an interconnect (not shown) connected to the contact plug 21b.

With the above-described method for fabricating a semiconductor device according to the third embodiment of the present invention, the structure of the semiconductor device shown with FIGS. 15A and 15B and the effects exerted by this structure can be provided. In the third embodiment, description has been made of the case where $SiO_2$ is used for the first insulating film serving as the first sidewalls 15a and 15b, and $Si_3N_4$ is used for the second insulating film serving as the second sidewalls 16a and 16b. Alternatively, another approach may be used in which $Si_3N_4$ is used for the first insulating film serving as the first sidewalls 15a and 15b and an oxide film such as $SiO_2$, PSG, or BPSD is used for the second insulating film serving as the second sidewalls 16a and 16b, and the second sidewalls 16a and 16b can be selectively removed by wet etching with hydrofluoric acid-based solution.

Also, to the above-mentioned semiconductor device and its fabrication method according to the third embodiment of the present invention, the first to third modifications of the first embodiment of the present invention are applicable in the same way.

In the first to third embodiments, if the thicknesses of the first sidewalls 15a and 15b are identical, the double of the thickness of the first sidewall 15a or the double of the thickness of the first sidewall 15b may be used instead of the sum of the thicknesses of the first sidewalls 15a and 15b. If the thicknesses of the second sidewalls 16a and 16b are identical, the double of the thickness of the second sidewall 16a or the double of the thickness of the second sidewall 16b may be used instead of the sum of the thicknesses of the second sidewalls 16a and 16b.

The present invention is useful for a semiconductor device having a structure in which an insulating film with internal stress produces stress in a channel region, and for its fabrication method.

What is claimed is:
1. A semiconductor device comprising:
    a first active region surrounded with an isolation region of a semiconductor substrate;
    a first gate electrode formed over the first active region and having a protrusion protruding on the isolation region;
    a first side-wall insulating film formed on the side surface of the first gate electrode;
    an auxiliary pattern formed over the semiconductor substrate to be spaced apart in the gate width direction from the protrusion of the first gate electrode;
    a second side-wall insulating film formed on the side surface of the auxiliary pattern; and
    a stress-containing insulating film containing internal stress and formed to cover the first gate electrode, the first side-wall insulating film, the auxiliary pattern, and the second side-wall insulating film,
    wherein the distance between the first gate electrode and the auxiliary pattern is smaller than the sum total of: the sum of the thicknesses of the first and second side-wall insulating films; and the double of the thickness of the stress-containing insulating film,
    the first side-wall insulating film includes a first sidewall formed on the side surface of the first gate electrode, and having an L-shaped cross section, and a second sidewall formed on the first sidewall,
    the first sidewall is made of an oxide film, and
    the second sidewall is made of a nitride film.
2. The device of claim 1, wherein a portion of the stress-containing insulating film formed in an area between the first gate electrode and the auxiliary pattern has a greater thickness than a portion of the stress-containing insulating film formed on the isolation region spaced apart in the gate length direction from the first side-wall insulating film.
3. The device of claim 1, wherein the top surface of a portion of the stress-containing insulating film formed in an area between the first gate electrode and the auxiliary pattern has an equal level to or a higher level than the top surface of the first gate electrode.
4. The device of claim 1, wherein the space between the first gate electrode and the auxiliary pattern is filled with the first and second side-wall insulating films and the stress-containing insulating film.
5. The device of claim 1, wherein the space between the first gate electrode and the auxiliary pattern is filled with the first and second side-wall insulating films.
6. The device of claim 1, wherein the distance between the first gate electrode and the auxiliary pattern is smaller than the sum of the thicknesses of parts of the first side-wall insulating film formed on the side surface of the first gate electrode parallel to the gate width direction and parts of the second side-wall insulating film formed on the side surface of the auxiliary pattern parallel to the gate width direction.
7. The device of claim 1, wherein each of the second sidewalls contains internal stress.
8. The device of claim 1, wherein the auxiliary pattern is a second gate electrode which is formed over a second active region surrounded with the isolation region of the semiconductor substrate and which has a protrusion protruding on the isolation region.

9. The device of claim 8, wherein
the first active region and the first gate electrode are provided in a field effect transistor which is an n-type MIS transistor, and
the second active region and the second gate electrode are provided in a field effect transistor which is a p-type MIS transistor.

10. The device of claim 8, wherein the side surfaces of the first and second gate electrodes located in the gate length direction face each other.

11. The device of claim 8, wherein the side surfaces of the first and second gate electrodes are shifted in the gate length direction with each other.

12. The device of claim 11, wherein a shift distance of the second gate electrode with respect to the first gate electrode is included within a range in which a part of the stress-containing insulating film formed on the side surface of the first gate electrode and a part of the stress-containing insulating film formed on the side surface of the second gate electrode partially overlap with each other in a gate length direction.

13. The device of claim 11, wherein
a shift distance of the second gate electrode with respect to the first gate electrode is 0 μm or more and less than a predetermined value,
the predetermined value is a sum of: a sum of a gate length of the first gate electrode and a total thickness of the first side-wall insulating film and a part of the stress-containing insulating film formed on the side surface of the first gate electrode; and a total thickness of the second side-wall insulating film and a part of the stress-containing insulating film formed on the side surface of the second gate electrode.

14. The device of claim 1, wherein the auxiliary pattern is formed only on the isolation region.

15. The device of claim 1, wherein the auxiliary pattern does not effectively perform electrical operations.

16. The device of claim 1, wherein the auxiliary pattern is made of a different material from that of the first gate electrode.

17. The device of claim 1, wherein the isolation region is formed from an STI (shallow trench isolation) made by filling a trench formed in the semiconductor substrate with an insulating film.

18. The device of claim 1, wherein the stress-containing insulating film is a silicon nitride film.

19. The device of claim 1, wherein
the first gate electrode is made of polysilicon, and
the first gate electrode includes a silicide layer including a nickel.

20. The device of claim 1, wherein the first gate electrode is formed on the first active region through a gate insulating film including nitrogen.

21. The device of claim 1, wherein
the first gate electrode is formed on the first active region through a gate insulating film, and
the gate insulating film is made of $SiO_2$, SiON or HfSiON.

22. The device of claim 1, wherein the first side-wall insulating film further includes an offset spacer having a plate-like cross section.

23. The device of claim 1, further comprising
a source region or a drain region formed in a region located outside the first side-wall insulating film in the first active region,
a silicide layer formed on the source region or the drain region,
an interlayer insulating film on the silicide layer through the stress-containing insulating film, and
a contact plug passing through the interlayer insulating film and the stress-containing insulating film to reach the silicide layer,
wherein the contact plug includes tungsten.

24. The device of claim 23, wherein the silicide layer includes nickel.

25. The device of claim 1, wherein the first side-wall insulating film and the second side-wall insulating film are in contact with each other in a region between the first gate electrode and the auxiliary pattern.

26. The device of claim 1, wherein the first active region and the first gate electrode are provided in a field effect transistor which is an n-type MIS transistor.

27. The device of claim 1, wherein the stress-containing insulating film generates a tensile stress in a channel length direction in the first active region.

28. The device of claim 1, wherein a minimum distance between the first side-wall insulating film and the second side-wall insulating film is less than twice a thickness of a part of the stress-containing insulating film on the first gate electrode, the distance being formed between the first gate electrode and the auxiliary pattern.

29. A semiconductor device comprising:
a first active region surrounded with an isolation region of a semiconductor substrate;
a first gate electrode formed over the first active region and having a protrusion protruding on the isolation region;
a first side-wall insulating film formed on the side surface of the first gate electrode;
an auxiliary pattern formed over the semiconductor substrate to be spaced apart in the gate width direction from the protrusion of the first gate electrode;
a second side-wall insulating film formed on the side surface of the auxiliary pattern; and
a stress-containing insulating film containing internal stress and formed to cover the first gate electrode, the first side-wall insulating film, the auxiliary pattern, and the second side-wall insulating film,
wherein the distance between the first gate electrode and the auxiliary pattern is smaller than the sum total of: the sum of the thicknesses of the first and second side-wall insulating films; and the double of the thickness of the stress-containing insulating film, and
the first side-wall insulating film and the second side-wall insulating film are in contact with each other in a region between the first gate electrode and the auxiliary pattern.

30. The device of claim 29, wherein a portion of the stress-containing insulating film formed in an area between the first gate electrode and the auxiliary pattern has a greater thickness than a portion of the stress-containing insulating film formed on the isolation region spaced apart in the gate length direction from the first side-wall insulating film.

31. The device of claim 29, wherein the space between the first gate electrode and the auxiliary pattern is filled with the first and second side-wall insulating films and the stress-containing insulating film.

32. The device of claim 29, wherein the distance between the first gate electrode and the auxiliary pattern is smaller than the sum of the thicknesses of parts of the first side-wall insulating film formed on the side surface of the first gate electrode parallel to the gate width direction and parts of the second side-wall insulating film formed on the side surface of the auxiliary pattern parallel to the gate width direction.

33. The device of claim 29, wherein each of the first and second side-wall insulating films includes a first sidewall with an L-shaped cross section.

34. The device of claim 29, wherein the auxiliary pattern is a second gate electrode which is formed over a second active region surrounded with the isolation region of the semiconductor substrate and which has a protrusion protruding on the isolation region.

35. The device of claim 34, wherein the side surfaces of the first and second gate electrodes located in the gate length direction face each other.

36. The device of claim 34, wherein the side surfaces of the first and second gate electrodes are shifted in the gate length direction with each other.

37. The device of claim 36, wherein a shift distance of the second gate electrode with respect to the first gate electrode is included within a range in which a part of the stress-containing insulating film formed on the side surface of the first gate electrode and a part of the stress-containing insulating film formed on the side surface of the second gate electrode partially overlap with each other in a gate length direction.

38. The device of claim 36, wherein
a shift distance of the second gate electrode with respect to the first gate electrode is 0 μm or more and less than a predetermined value,
the predetermined value is a sum of: a sum of a gate length of the first gate electrode and a total thickness of the first side-wall insulating film and a part of the stress-containing insulating film formed on the side surface of the first gate electrode; and a total thickness of the second side-wall insulating film and a part of the stress-containing insulating film formed on the side surface of the second gate electrode.

39. The device of claim 29, wherein the stress-containing insulating film is a silicon nitride film.

40. The device of claim 29, wherein
the first gate electrode is made of polysilicon, and
the first gate electrode includes a silicide layer including a nickel.

41. The device of claim 29, wherein the first gate electrode is formed on the first active region through a gate insulating film including nitrogen.

42. The device of claim 29, further comprising
a source region or a drain region formed in a region located outside the first side-wall insulating film in the first active region,
a silicide layer formed on the source region or the drain region,
an interlayer insulating film on the silicide layer through the stress-containing insulating film, and
a contact plug passing through the interlayer insulating film and the stress-containing insulating film to reach the silicide layer,
wherein the contact plug includes tungsten, and
the silicide layer includes nickel.

43. A semiconductor device comprising:
a first active region surrounded with an isolation region of a semiconductor substrate;
a first gate electrode formed over the first active region and having a protrusion protruding on the isolation region;
a first side-wall insulating film formed on the side surface of the first gate electrode;
a second active region surrounded with the isolation region of the semiconductor substrate;
a second gate electrode formed over the second active region, having a protrusion protruding on the isolation region, and formed over the semiconductor substrate to be spaced apart in the gate width direction from the protrusion of the first gate electrode;
a second side-wall insulating film formed on the side surface of the second gate electrode; and
a silicon nitride film formed to cover the first gate electrode, the first side-wall insulating film, the second gate electrode, and the second side-wall insulating film,
wherein the distance between the first gate electrode and the second gate electrode is smaller than the sum total of: the sum of the thicknesses of the first and second side-wall insulating films; and the double of the thickness of the silicon nitride film,
the side surfaces of the first and second gate electrodes are shifted in the gate length direction with each other,
a shift distance of the second gate electrode with respect to the first gate electrode is 0 μm or more and less than a predetermined value,
the predetermined value is a sum of: a sum of a gate length of the first gate electrode and a total thickness of the first side-wall insulating film and a part of the silicon nitride film formed on the side surface of the first gate electrode; and a total thickness of the second side-wall insulating film and a part of the silicon nitride film formed on the side surface of the second gate electrode.

44. The device of claim 43, wherein a portion of the silicon nitride film formed in an area between the first gate electrode and the second gate electrode has a greater thickness than a portion of the silicon nitride film formed on the isolation region spaced apart in the gate length direction from the first side-wall insulating film.

45. The device of claim 43, wherein the top surface of a portion of the silicon nitride film formed in an area between the first gate electrode and the second gate electrode has an equal level to or a higher level than the top surface of the first gate electrode.

46. The device of claim 43, wherein the space between the first gate electrode and the second gate electrode is filled with the first and second side-wall insulating films and the silicon nitride film.

47. The device of claim 43, wherein the space between the first gate electrode and the second gate electrode is filled with the first and second side-wall insulating films.

48. The device of claim 43, wherein the distance between the first gate electrode and the second gate electrode is smaller than the sum of the thicknesses of parts of the first side-wall insulating film formed on the side surface of the first gate electrode parallel to the gate width direction and parts of the second side-wall insulating film formed on the side surface of the second gate electrode parallel to the gate width direction.

49. The device of claim 43, wherein each of the first and second side-wall insulating films includes a first sidewall with an L-shaped cross section.

50. The device of claim 49, wherein each of the first and second side-wall insulating films further includes a second sidewall formed to cover an L-shaped inner surface of the first sidewall.

51. The device of claim 50, wherein each of the second sidewalls contains internal stress.

52. The device of claim 43, wherein the isolation region is formed from an STI (shallow trench isolation) made by filling a trench formed in the semiconductor substrate with an insulating film.

53. The device of claim 43, wherein
the first gate electrode is made of polysilicon, and
the first gate electrode includes a silicide layer including a nickel.

54. The device of claim 43, wherein the first gate electrode is formed on the first active region through a gate insulating film including nitrogen.

55. The device of claim 43, wherein
the first gate electrode is formed on the first active region through a gate insulating film, and
the gate insulating film is made of $SiO_2$, SiON or HfSiON.

56. The device of claim 43, wherein the first side-wall insulating film further includes an offset spacer having a plate-like cross section.

57. The device of claim 43, further comprising
a source region or a drain region formed in a region located outside the first side-wall insulating film in the first active region,
a silicide layer formed on the source region or the drain region,
an interlayer insulating film on the silicide layer through the silicon nitride film, and
a contact plug passing through the interlayer insulating film and the silicon nitride film to reach the silicide layer,
wherein the contact plug includes tungsten.

58. The device of claim 57, wherein the silicide layer includes nickel.

59. The device of claim 43, wherein the first active region and the first gate electrode are provided in a field effect transistor which is an n-type MIS transistor.

60. The device of claim 43, wherein the silicon nitride film generates a tensile stress in a channel length direction in the first active region.

61. The device of claim 43, wherein a minimum distance between the first side-wall insulating film and the second side-wall insulating film is less than twice a thickness of a part of the silicon nitride film on the first gate electrode, the distance being formed between the first gate electrode and the second gate electrode.

62. The device of claim 43, wherein
the first active region and the first gate electrode are provided in a field effect transistor which is an n-type MIS transistor, and
the second active region and the second gate electrode are provided in a field effect transistor which is a p-type MIS transistor.

63. The device of claim 43, wherein a shift distance of the second gate electrode with respect to the first gate electrode is included within a range in which a part of the silicon nitride film formed on the side surface of the first gate electrode and a part of the silicon nitride film formed on the side surface of the second gate electrode partially overlap with each other in a gate length direction.

64. The device of claim 43, wherein the silicon nitride film is continuously formed so that the silicon nitride film covers a region from an upper surface of the protrusion of the first gate electrode to an upper surface of a part of the first gate electrode on the first active region.

* * * * *